(12) United States Patent
Huang et al.

(10) Patent No.: US 11,862,633 B2
(45) Date of Patent: Jan. 2, 2024

(54) WORK FUNCTION DESIGN TO INCREASE DENSITY OF NANOSHEET DEVICES

(71) Applicant: Taiwan Semiconductor Manufacturing Company, Ltd., Hsin-Chu (TW)

(72) Inventors: Mao-Lin Huang, Hsinchu (TW); Chih-Hao Wang, Baoshan Township (TW); Kuo-Cheng Chiang, Zhubei (TW); Jia-Ni Yu, New Taipei (TW); Lung-Kun Chu, New Taipei (TW); Chung-Wei Hsu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 31 days.

(21) Appl. No.: 17/676,403

(22) Filed: Feb. 21, 2022

(65) Prior Publication Data

US 2022/0173096 A1    Jun. 2, 2022

Related U.S. Application Data

(63) Continuation of application No. 16/874,907, filed on May 15, 2020, now Pat. No. 11,257,815.

(Continued)

(51) Int. Cl.
*H01L 27/088* (2006.01)
*H01L 29/06* (2006.01)
(Continued)

(52) U.S. Cl.
CPC ...... *H01L 27/088* (2013.01); *H01L 21/02603* (2013.01); *H01L 21/82345* (2013.01);
(Continued)

(58) Field of Classification Search
CPC ............ H01L 27/088; H01L 21/02603; H01L 21/823412; H01L 21/82345;
(Continued)

(56) References Cited

U.S. PATENT DOCUMENTS 10,103,065 B1    10/2018  Mochizuki et al.
11,257,815 B2 *  2/2022  Huang .............. H01L 29/42376
(Continued)

OTHER PUBLICATIONS

Shin, Changhwan."Advanced MOSFET Designs and Implications for SRAM Scaling." University of California, Berkeley. Published in 2011.

(Continued)

*Primary Examiner* — Tong-Ho Kim
(74) *Attorney, Agent, or Firm* — Eschweiler & Potashnik, LLC

(57) ABSTRACT

In some embodiments, the present disclosure relates to an integrated chip. The integrated chip includes a first transistor having a first conductivity type arranged over a substrate. The first transistor includes a first gate electrode layer having a first work function and extending from a first source/drain region to a second source/drain region, and a first channel structure embedded in the first gate electrode layer and extending from the first source/drain region to the second source/drain region. A second transistor having the first conductivity type is arranged laterally beside the first transistor. The second transistor includes a second gate electrode layer having a second work function that is different than the first work function and extending from a third source/drain region to a fourth source/drain region. A second channel structure is embedded in the second gate electrode layer and extends from the third source/drain region to the fourth source/drain region.

20 Claims, 23 Drawing Sheets

Related U.S. Application Data

(60) Provisional application No. 62/928,525, filed on Oct. 31, 2019.

(51) Int. Cl.

| | | |
|---|---|---|
| *H01L 29/423* | (2006.01) | |
| *H01L 29/49* | (2006.01) | |
| *H01L 29/66* | (2006.01) | |
| *H01L 21/02* | (2006.01) | |
| *H01L 21/8234* | (2006.01) | |
| *H01L 29/786* | (2006.01) | |

(52) U.S. Cl.
CPC .. *H01L 21/823412* (2013.01); *H01L 29/0673* (2013.01); *H01L 29/42392* (2013.01); *H01L 29/4908* (2013.01); *H01L 29/66545* (2013.01); *H01L 29/66742* (2013.01); *H01L 29/78696* (2013.01)

(58) Field of Classification Search
CPC ........... H01L 29/0673; H01L 29/42392; H01L 29/4908; H01L 29/66545; H01L 29/66742; H01L 29/78696; H01L 29/42376; H01L 29/401; H01L 29/66439; H01L 29/775; B82Y 10/00

USPC ........................................................ 257/350
See application file for complete search history.

(56) References Cited

U.S. PATENT DOCUMENTS

| | | | |
|---|---|---|---|
| 2018/0315667 A1* | 11/2018 | Kwon | .................. H01L 29/4966 |
| 2019/0378911 A1* | 12/2019 | Lee | ....................... H01L 29/511 |
| 2021/0013111 A1* | 1/2021 | Smith | .................. H01L 27/0922 |
| 2021/0057281 A1 | 2/2021 | Liaw | |

OTHER PUBLICATIONS

Lin et al. "Work Function Adjustment by Using Dipole Engineering for TaN—Al2O3—Si3N4—HfSiOx-Silicon Nonvolatile Memory." Materials 2015, 8, 5112-5120; doi: 10.3390/ma8085112, published Aug. 7, 2015.

Erben, et al. Work Function Setting in High-k Metal Gate Devices | IntechOpen. Published Nov. 5, 2018.

Non-Final Office Action dated Apr. 26, 2021 for U.S. Appl. No. 16/874,907.

Notice of Allowance dated Oct. 28, 2021 for U.S. Appl. No. 16/874,907.

\* cited by examiner

WORK FUNCTION DESIGN TO INCREASE DENSITY OF NANOSHEET DEVICES

REFERENCE TO RELATED APPLICATIONS

This application is a Continuation of U.S. application Ser. No. 16/874,907, filed on May 15, 2020, which claims the benefit of U.S. Provisional Application No. 62/928,525, filed on Oct. 31, 2019. The contents of the above-referenced patent applications are hereby incorporated by reference in their entirety.

BACKGROUND

The semiconductor industry continues to improve the integration density of various electronic devices (e.g., transistors, diodes, resistors, capacitors, etc.) by, for example, reducing minimum feature sizes and/or arranging electronic devices closer to one another, which allows more components to be integrated into a given area. For example, a nanosheet field effect transistor (NSFET) comprising vertically arranged nanosheet channel structures, wherein multiple gates surround each nanosheet channel structure to reduce device area and to increase device control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
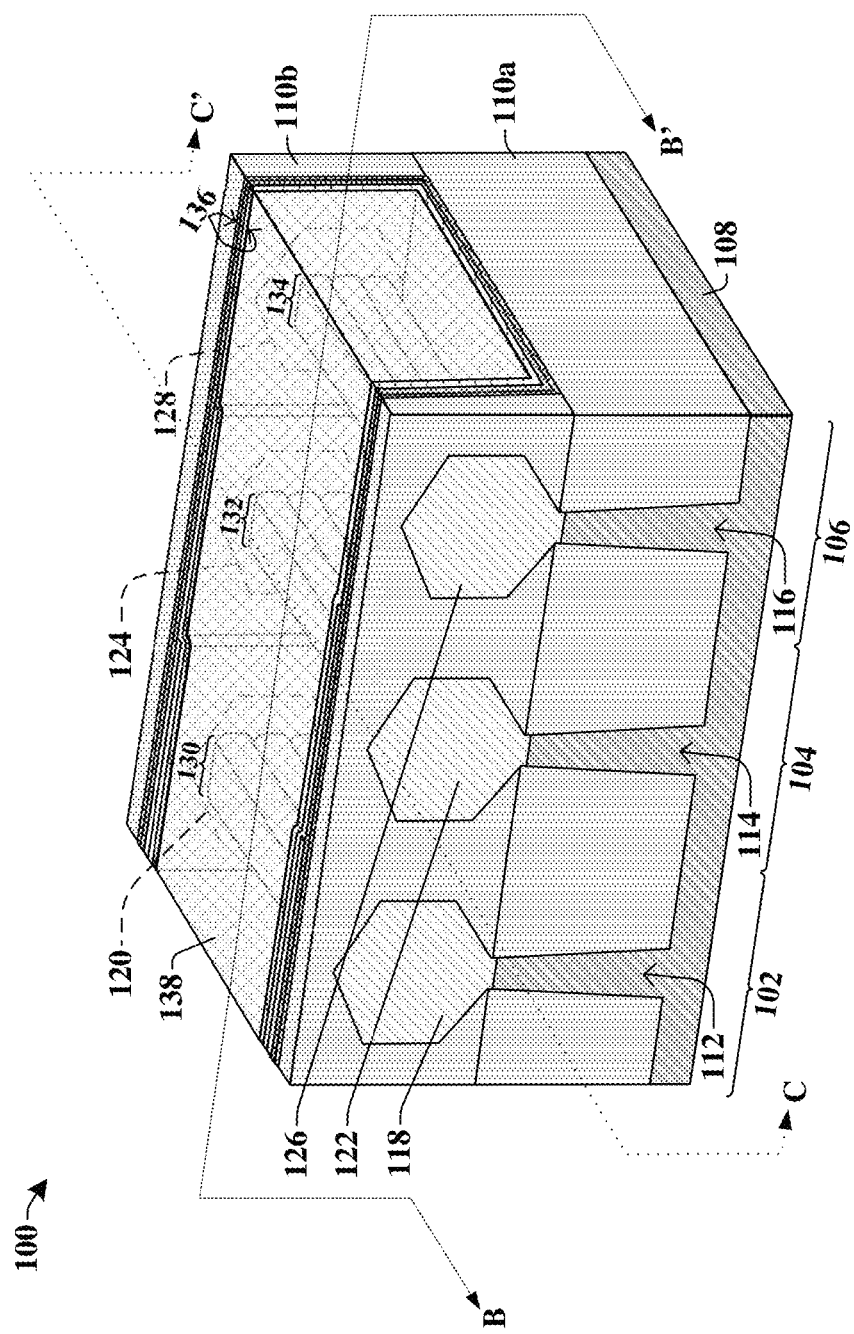
FIG. 1 illustrates a perspective view of some embodiments of a device comprising three nanosheet field effect transistors (NSFETs) having three different gate electrode structures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a nanosheet field effect transistor (NSFET) may comprise nanosheet channel structures that extend in parallel from a first source/drain region to a second source/drain region. The nanosheet channel structures may be continuously surrounded by gate electrode layers to form a gate electrode structure. Thus, the nanosheet channel structures may be turned "ON" to allow mobile charge carriers to travel from the first source/drain region to the second source/drain region by applying a voltage bias across the gate electrode structure that exceeds a threshold voltage of the NSFET.

The threshold voltage of the NSFET depends on the work function of the gate electrode structure, which can be controlled by, for example, the material of the gate electrode layers, doping concentration of the gate electrode layers, dipole engineering of the gate dielectric layers, and/or the length of the gate electrode structure. However, in an NSFET device, the vertical spacing between nanosheet channel structures may limit the effectiveness of doping of the gate dielectric layers, and dipole engineering may not provide a large enough change in work function. Further, the vertical spacing between nanosheet channel structures and process limitations may reduce the number of gate electrode layers in the gate electrode structure. Thus, in some embodiments, the vertical spacing between nanosheet channel structures is increased to accommodate more gate electrode layers in the gate electrode structure to achieve desired work function of the gate electrode structure. However, increasing the vertical spacing between nanosheet channel structures negatively increases the overall height of the NSFET device. For example, in a static random access memory (SRAM) device, one SRAM cell comprises at least 4 transistors, and thus, an increase in spacing of each transistor may significantly increase each SRAM cell size, thereby impacting the storage per space capability of the SRAM device.

Various embodiments of the present disclosure are directed towards a method of forming a first NSFET having a first gate electrode structure beside a second NSFET having a second gate electrode structure that is beside a third NSFET having a third gate electrode structure without sacrificing device density. In some embodiments, the first gate electrode structure may comprise a first gate electrode layer continuously surrounding first nanosheet channel structures of the first NSFET; the second gate electrode structure may comprise a second gate electrode layer continuously surrounding second nanosheet channel structures of the second NSFET; and the third gate electrode structure may comprise a third gate electrode layer continuously surrounding third nanosheet channel structures of the third NSFET, wherein the first, second, and third gate electrode layers are different from one another.

In some embodiments to form the at least first, second, and third NSFETs, a first dummy masking structure may be formed directly between the first nanosheet channel structures of the first NSFET; a second dummy masking structure may be formed directly between the second nanosheet channel structures of the second NSFET; and a third dummy masking structure may be formed directly between the third nanosheet channel structures of the third NSFET. In some embodiments, the first dummy masking structure may be removed, and the first gate electrode layer may be formed over the first, second, and third nanosheet channel structures. Then, the first gate electrode layer may be selectively removed from the second and third nanosheet channel structures. The second and third dummy masking structures prevent the formation of the first gate electrode layer vertically between the second nanosheet channel structure and vertically between the third nanosheet channel structures, thereby reducing the maximum dimensions of the first gate electrode layer to be removed from the second and third nanosheet channel structures to prevent inadvertent over-etching of the first gate electrode layer on the first nanosheet channel structures. The method may continue to form a second gate electrode layer on the second nanosheet channel structures and to form a third gate electrode layer on the third nanosheet channel structures, wherein the second and/or third dummy masking structures aid in preventing over-etching of the second and/or third gate electrode layers. Thus, because of the first, second, and third dummy masking structures, the first NSFET may be formed laterally beside the second NSFET, and the third NSFET may be formed laterally beside the second NSFET without sacrificing device density or device reliability.

FIG. 1 illustrates a perspective view 100 of some embodiments of a second nanosheet field effect transistor (NSFET) arranged between a first NSFET and a third NSFET, wherein the first, second, and third NSFETs have different threshold voltages.

The perspective view 100 illustrates a first NSFET 102, a second NSFET 104, and a third NSFET 106 arranged on a substrate 108. It will be appreciated that in some instances, the NSFETs (e.g., 102, 104, 106) may be also known as, for example, a gate-all-around FET, a gate surrounding transistor, a multi-bridge channel (MBC) transistor, a nanowire FET, or the like. In some embodiments, the substrate 108 comprises a first fin structure 112, a second fin structure 114, and a third fin structure 116 that protrude from the substrate 108 through a lower isolation structure 110a. In some embodiments, the second fin structure 114 is arranged between the first fin structure 112 and the third fin structure 116, and the first, second, and third fin structures 112, 114, 116 are spaced apart from one another by the lower isolation structure 110a.

In some embodiments, the first NSFET 102 comprises a first source/drain region 118 and a second source/drain region 120 that are embedded in an upper isolation structure 110b and that are arranged over the first fin structure 112. The second source/drain region 120 is illustrated with a hashed line because in some embodiments, the second source/drain region 120 is not visible from the perspective view 100 of FIG. 1. A first gate electrode structure 130 is arranged directly over the first fin structure 112, extends from the first source/drain region 118 to the second source/drain region 120, and surrounds first nanosheet channel structures (see, 202 of FIG. 2) that also extend from the first source/drain region 118 to the second source/drain region 120.

In some embodiments, the second NSFET 104 comprises a third source/drain region 122 and a fourth source/drain region 124 that are embedded in the upper isolation structure 110b and that are arranged over the second fin structure 114. The fourth source/drain region 124 is illustrated with a hashed line because in some embodiments, the fourth source/drain region 124 is not visible from the perspective view 100 of FIG. 1. A second gate electrode structure 132 is arranged directly over the second fin structure 114, extends from the third source/drain region 122 to the fourth source/drain region 124, and surrounds second nanosheet channel structures (see, 204 of FIG. 2) that also extend from the third source/drain region 122 to the fourth source/drain region 124.

In some embodiments, the third NSFET 106 comprises a fifth source/drain region 126 and a sixth source/drain region 128 that are embedded in the upper isolation structure 110b and that are arranged over the third fin structure 116. The sixth source/drain region 128 is illustrated with a hashed line because in some embodiments, the sixth source/drain region 128 is not visible from the perspective view 100 of FIG. 1. A third gate electrode structure 134 is arranged directly over the third fin structure 116, extends from the fifth source/drain region 126 to the sixth source/drain region 128, and surrounds third nanosheet channel structures (see, 206 of FIG. 2) that also extend from the fifth source/drain region 126 to the sixth source/drain region 128.

Further, in some embodiments, a filler layer 138 may be arranged over the lower isolation structure 110a and surround the first, second, and third gate electrode structures 130, 132, 134. It will be appreciated that the filler layer 138 is illustrated as somewhat transparent such that the first, second, and third gate electrode structures 130, 132, 134 may be visible in FIG. 1, and thus, in some embodiments, the filler layer 138 is not transparent or is not somewhat transparent.

In some embodiments, the substrate 108, the first fin structure 112, the second fin structure 114, the third fin structure 116, the first nanosheet channel structures (see, 202 of FIG. 2), the second nanosheet channel structures (see, 204 of FIG. 2), the third nanosheet channel structures (see, 206 of FIG. 2) comprise an intrinsic semiconductor material, such as, for example, silicon, germanium, or the like. In some embodiments, the first and second source/drain regions 118, 120 may have a first doping type and a first doping concentration; the third and fourth source/drain regions 122, 124 may have a second doping type and a second doping concentration; and the fifth and sixth source/drain regions 126, 128 may have a third doping type and a third doping concentration. In some embodiments, the first, second, and/or third doping types are different from one another, whereas in other embodiments, the first, second, and/or third doping types may be the same as one another. Similarly, in some embodiments, the first, second, and/or third doping concentrations may be different from one another, whereas in other embodiments, the first, second, and/or third doping concentrations may be the same as one another. The doping type and/or concentrations may influence the threshold voltages of each of the first, second, and third NSFETs 102, 104, 106.

Further, in some embodiments, the first gate electrode structure 130, the second gate electrode structure 132, and the third gate electrode structure 134 respectively influence the first threshold voltage of the first NSFET 102, the second threshold voltage of the second NSFET 104, and the third threshold voltage of the third NSFET 106. In some embodiments, the first, second, and third gate electrode structures 130, 132, 134 comprise various gate electrode layers 136, which will be described in more detail in FIG. 2. Nevertheless, due to dummy masking structures formed during the formation of the first, second, and third gate electrode structures 130, 132, 134, the first NSFET 102, the second NSFET 104, and the third NSFET 106 may be formed over a same substrate and have different threshold voltages from one another without sacrificing the reliability or the device density of the overall device.

Figure 2:
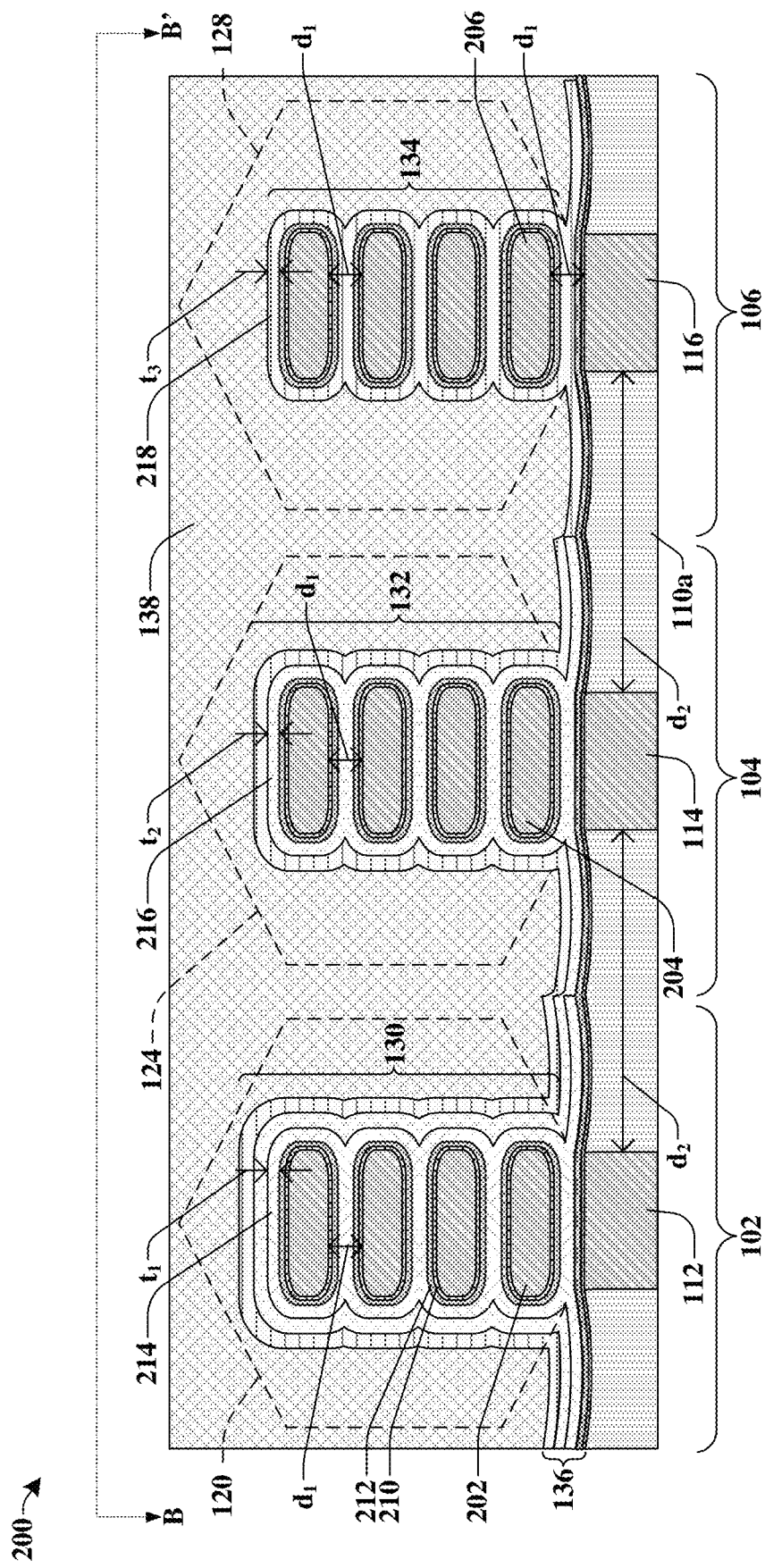
FIGS. 2 and 3 illustrate cross-sectional views of some NSFETs corresponding to some embodiments of the perspective view of FIG. 1.

FIG. 2 illustrates a cross-sectional view 200 of some embodiments of the second NSFET 104 arranged between the first NSFET 102 and the third NSFET 106. In some embodiments, the cross-sectional view 200 of FIG. 2 may correspond to cross-section line BB' of FIG. 1.

As illustrated in FIG. 2, in some embodiments, the first NSFET 102 comprises first nanosheet channel structures 202 arranged over the first fin structure 112; the second NSFET 104 comprises second nanosheet channel structures 204 arranged over the second fin structure 114; and the third NSFET 106 comprises third nanosheet channel structures 206 arranged over the third fin structure 116. It will be appreciated that in some other embodiments, the NSFETs (102, 104, 106) may each comprise more or less than four nanosheet channel structures (202, 204, 206). Further, in some embodiments, the vertically arranged first nanosheet channel structures 202 may be spaced apart from one another in the vertical direction by a first distance $d_1$; the vertically arranged second nanosheet channel structures 204 may be spaced apart from one another in the vertical direction by the first distance $d_1$; and the vertically arranged third nanosheet channel structures 206 may be spaced apart from one another in the vertical direction by the first distance $d_1$. In some embodiments, the first distance $d_1$ may be less than or equal to approximately 12 nanometers. In other embodiments, the first distance $d_1$ may be greater than approximately 12 nanometers. Further, in some embodiments, the first fin structure 112 may be spaced apart from the second fin structure 114 by a second distance $d_2$, and the second fin structure 114 may be spaced apart from the third fin structure 116 by the second distance $d_2$. In other embodiments, the second distance $d_2$ between the first and second fin structures 112, 114 may be different from the second distance $d_2$ between the second and third fin structures 114, 116. In some embodiments, the second distance $d_2$ may be in a range of between approximately 10 nanometers and approximately 50 nanometers, for example. It will be appreciated that other values for the second distance $d_2$ are also within the scope of the disclosure.

In some embodiments, the first nanosheet channel structures 202 are embedded in the first gate electrode structure 130; the second nanosheet channel structures 204 are embedded in the second gate electrode structure 132; and the third nanosheet channel structures 206 are embedded in the third gate electrode structure 134. In some embodiments, the first, second, and third gate electrode structures 130, 132, 134 comprise an interfacial layer 210 and a gate dielectric layer 212. In some embodiments, the interfacial layer 210 comprises multiple ring-like structures that continuously surround and contact each of the first, second, and third nanosheet channel structures 202, 204, 206. Further, the gate dielectric layer 212 may also comprise ring-like structures that continuously surround each of the first, second, and third nanosheet channel structures 202, 204, 206 and contact the interfacial layer 210. In such embodiments, the gate dielectric layer 212 and the interfacial layer 210 are not continuously connect layers. Instead the gate dielectric layer 212 and the interfacial layer 210 have multiple ring-like portions that are disconnected from one another from the cross-sectional view 200 of FIG. 2.

In some embodiments, the gate dielectric layer 212 high-k dielectric material, such as, for example, hafnium dioxide, zirconium dioxide, hafnium silicon oxide, or some other suitable dielectric material. In some embodiments, the gate dielectric layer 212 may also be used to tune the work functions and thus, threshold voltages of the first, second, and third NSFETs 102, 104, 106 through dipole engineering. In such embodiments, the gate dielectric layer 212 may comprise lanthanum, magnesium, yttrium, aluminum, niobium, titanium, or some other suitable material used for dipole engineering in the gate dielectric layer 212. For example, in some embodiments of a p-type NSFET, wherein mobile charge carriers are positive (e.g., holes), the gate dielectric layer 212 may comprise aluminum, niobium, or titanium, whereas in embodiment of an n-type NSFET, wherein mobile charge carriers are negative (e.g., electrons), the gate dielectric layer 212 may comprise lanthanum, magnesium, or yttrium. Further, in some embodiments, the interfacial layer 210 may comprise an oxide, such as, for example, silicon dioxide. It will be appreciated that other materials for the interfacial layer 210 and the gate dielectric layer 212 are also within the scope of this disclosure.

Further, in some embodiments, the first gate electrode structure 130 comprises a first gate electrode layer 214 that is a continuously connected layer fully surrounding each of the first nanosheet channel structures 202. Thus, the first gate electrode layer 214 is arranged directly between each of the first nanosheet channel structures 202. Further, the first gate electrode layer 214 is arranged directly between a lowermost one of the first nanosheet channel structures 202 and the first fin structure 112. The first gate electrode layer 214 has a first thickness $t_1$ that is less than the first distance $d_1$, in some embodiments.

In some embodiments, the second gate electrode structure 132 comprises a second gate electrode layer 216 that is a continuously connected layer fully surrounding each of the second nanosheet channel structures 204. Thus, the second gate electrode layer 216 is arranged directly between each of the second nanosheet channel structures 204. Further, the second gate electrode layer 216 is arranged directly between a lowermost one of the second nanosheet channel structures 204 and the second fin structure 114. The second gate electrode layer 216 has a second thickness $t_2$ that is less than the first distance $d_1$, in some embodiments. In some embodiments, the second gate electrode layer 216 may also be arranged over outer surfaces of the first gate electrode layer 214. However, in such embodiments, the second gate electrode layer 216 may not contribute to or may not significantly contribute to the first threshold voltage of the first NSFET 102. Instead, the first threshold voltage of the first NSFET 102 is dominated at least by the first gate electrode layer 214 continuously surrounding each of the first nanosheet channel structures 202.

In some embodiments, the third gate electrode structure 134 comprises a third gate electrode layer 218 that is a continuously connected layer fully surrounding each of the third nanosheet channel structures 206. Thus, the third gate electrode layer 218 is arranged directly between each of the third nanosheet channel structures 206. Further, the third gate electrode layer 218 is arranged directly between a lowermost one of the third nanosheet channel structures 206 and the third fin structure 116. The third gate electrode layer 218 has a third thickness $t_3$ that is less than the first distance $d_1$, in some embodiments. In some embodiments, the third gate electrode layer 218 may also be arranged over outer surfaces of the second gate electrode layer 216 of the second NSFET 104 and the first NSFET 102. However, in such embodiments, the third gate electrode layer 218 may not contribute to or may not significantly contribute to the first threshold voltage of the first NSFET 102 or the second NSFET 104. Instead, the first threshold voltage of the first NSFET 102 is dominated at least by the first gate electrode layer 214 continuously surrounding each of the first nanosheet channel structures 202, and the second threshold voltage of the second NSFET 104 is dominated at least by the second gate electrode layer 216 continuously surrounding each of the second nanosheet channel structures 204.

In some embodiments, the first, second, and third gate electrode layers 214, 216, 218 may comprise different materials, and thus, the first NSFET 102, the second NSFET 104, and the third NSFET 106 may have different threshold voltages. For example, in some embodiments, the first NSFET 102 may be an n-type NSFET, wherein the mobile charge carriers are electrons and the first threshold voltage is positive. In such embodiments, the first gate electrode layer 214 may comprise, for example, titanium aluminum, titanium aluminum carbon, titanium silicon aluminum carbon, or some other suitable conductive material. Further, for example, in some embodiments, the third NSFET 106 may be, for example, a p-type NSFET, wherein the mobile charge carriers are electrons and the third threshold voltage is negative. In such embodiments, the third gate electrode layer 218 may comprise, for example, titanium nitride, tungsten carbon nitride, tungsten, tantalum nitride, or some other suitable conductive material. Even further, for example, the second NSFET 104 may be a p-type, an n-type or some mid-gap type NSFET. In such embodiments, the second gate electrode layer 216 may comprise, for example, titanium aluminum nitride, titanium silicon nitride, titanium nitride, silicon, or some other suitable conductive material. Further, in some embodiments, the first, second, and/or third NSFETS 102, 104, 106 may comprise a passivation layer (not shown) directly contacting and surrounding the gate dielectric layer 212. In such embodiments, the passivation layer may comprise, for example, titanium nitride, silicon, or some other suitable passivation material to further tune the work function and thus, threshold voltages of the NSFETs (102, 104, 106).

It will be appreciated that other designs of multiple NSFETs over a same substrate (108 of FIG. 1) are also within the scope of this disclosure. For example, in some embodiments, more or less than three NSFETs may be disposed over the same substrate (108 of FIG. 1). Further, for example, in some embodiments, the first, second, and third NSFETs 102, 104, 106 may all be n-type NSFETs but still have different threshold voltages due to different first, second, and third gate electrode structures 130, 132, 134.

Figure 3:
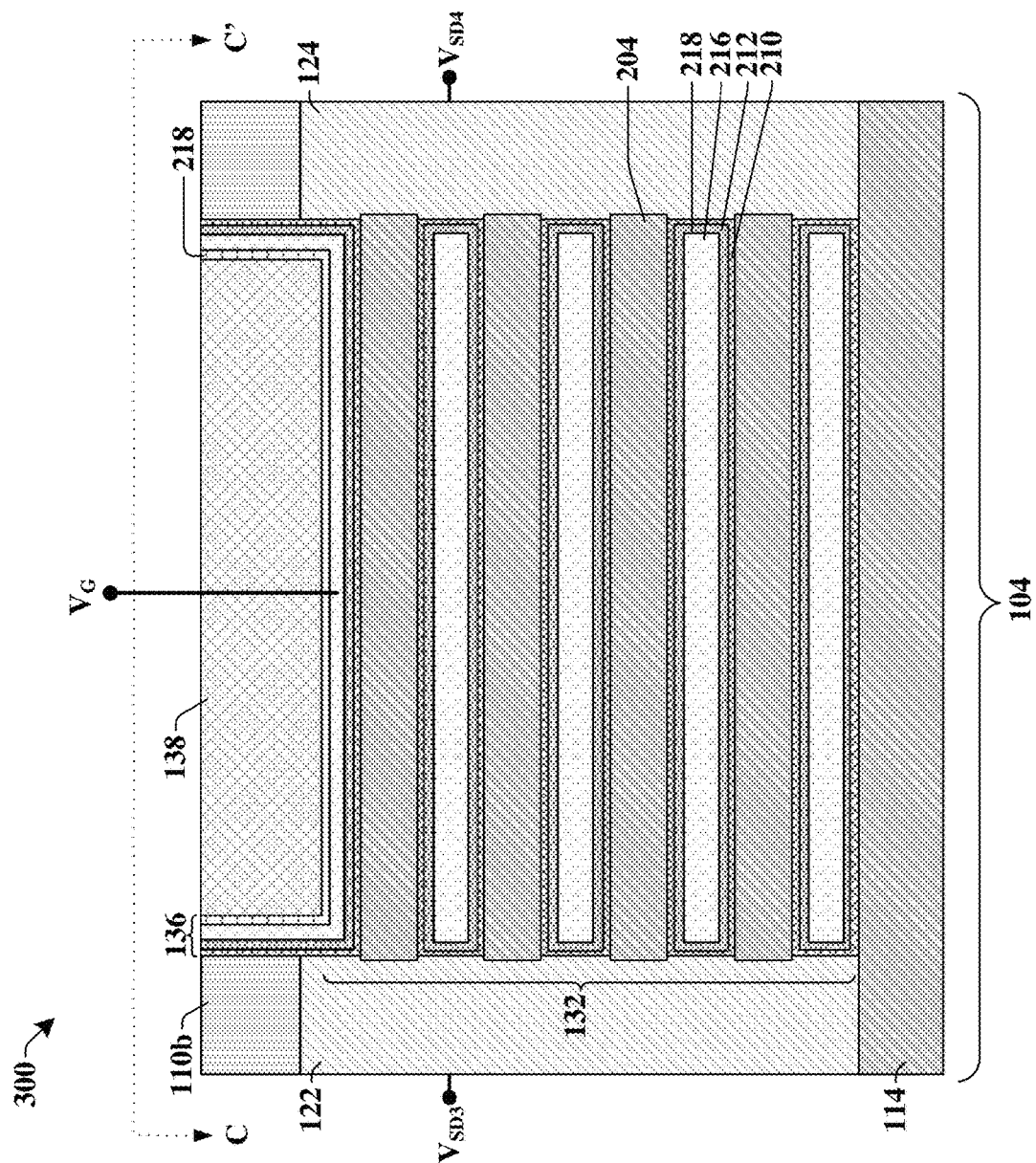

FIG. 3 illustrates a cross-sectional view 300 of some embodiments of the second NSFET 104 that may correspond to cross-section line CC' of FIG. 1.

As illustrated in FIG. 3, in some embodiments, the second nanosheet channel structures 204 extend in parallel from the third source/drain region 122 to the fourth source/drain region 124. Further, the second nanosheet channel structures 204 directly contact the third and fourth source/drain regions 122, 124, in some embodiments. In some embodiments, during the formation of the multiple gate electrode layers 136, the multiple gate electrode layers 136 are formed on the second fin structure 114, the second nanosheet channel structures 204, the third source/drain region 122, and the fourth source/drain region 124. Thus, in some embodiments, from the cross-sectional view 300 of FIG. 3, some of the multiple gate electrode layers 136, such as the interfacial layer 210 and the gate dielectric layer 212, exhibit rectangular ring-like shapes. In other embodiments, the multiple gate electrode layers 136 may exhibit more oval-like or circular ring-like shapes from the cross-sectional view 300 of FIG. 3.

During operation of the second NSFET 104, a gate voltage VG may be applied to the second gate electrode structure 132, a third source/drain voltage $V_{SD3}$ may be applied to the third source/drain region 122, and a fourth source/drain voltage $V_{SD4}$ may be applied to the fourth source/drain region 124. In some embodiments, when an absolute value of the gate voltage VG exceeds an absolute value of the second threshold voltage of the second NSFET 104, the second NSFET 104 is turned "ON" such that mobile charge carriers (e.g., electrons, holes) between the third source/drain region 122 and the fourth source/drain region 124. In some embodiments, contact vias couple the second gate electrode structure 132, the third source/drain region 122, and the fourth source/drain region 124 to a gate voltage source, a third source/drain voltage source, and a fourth source/drain voltage source, respectively. In some embodiments, the filler layer 138 comprises a conductive material, such as, for example, titanium nitride, tantalum nitride, or the like. Thus, the filler layer 138 may be electrically coupled to the second gate electrode structure 132. Because of the compositions and thicknesses of the multiple gate electrode layers 136 of the second gate electrode structure 132 and the manufacturing thereof, the second threshold voltage of the second NSFET 104 may be designed to be a desired value. Therefore, when the gate voltage VG exceeds the second threshold voltage of the second NSFET 104, the second nanosheet channel structures 204 may be simultaneously and reliably turned "ON."

FIGS. 4-26 illustrate various views 400-2600 of some embodiments of a method of forming first, second, and third NSFETs arranged over a substrate and having different threshold voltages Although FIGS. 4-26 are described in relation to a method, it will be appreciated that the structures disclosed in FIGS. 4-26 are not limited to such a method, but instead may stand alone as structures independent of the method.

Figure 4:
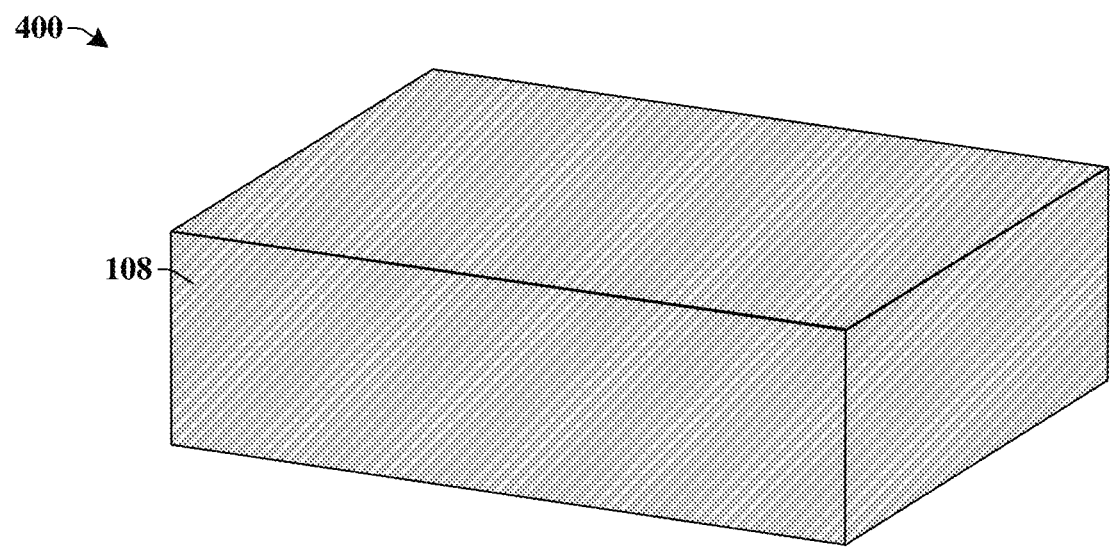
FIGS. 4-26 illustrate various views of some embodiments of a method of forming a first, second, and third NSFET having a first, second, and third gate electrode structures, respectively, wherein the first, second, and third gate electrode structures are different from one another.

As shown in perspective view 400 of FIG. 4, a substrate 108 is provided. In some embodiments, the substrate 108 may be or comprise a semiconductor wafer, a semiconductor substrate, a silicon-on-insulator (SOI) substrate, or some other suitable substrate. In some embodiments, the substrate 108 may comprise a first semiconductor material such as, for example, silicon, germanium, or some other suitable semiconductor material. In such embodiments, the substrate 108 may be an intrinsic (e.g., not doped) semiconductor.

Figure 5:
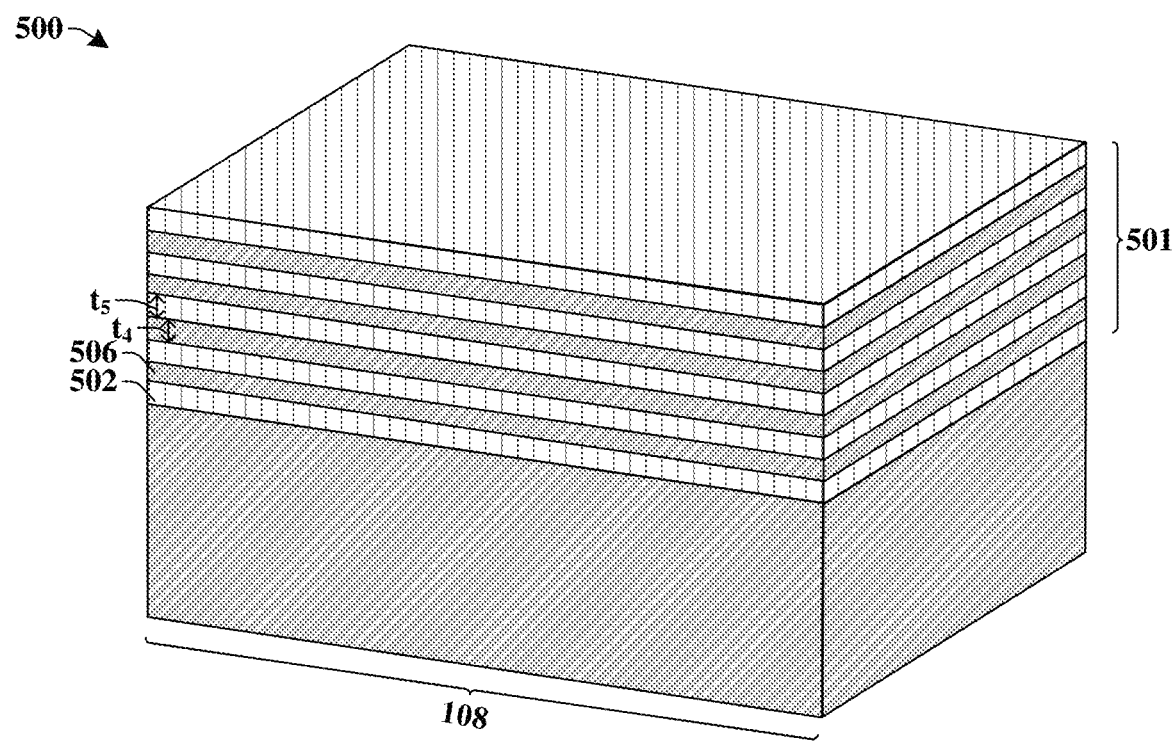

As shown in perspective view 500 of FIG. 5, in some embodiments, a stack of semiconductor layers 501 may be formed over the substrate 108. The stack of semiconductor layers 501 may comprise spacer layers 502 and semiconductor layers 506, wherein the spacer layers 502 and the semiconductor layers 506 are arranged in an alternating order in the stack of semiconductor layers 501. In other words, each one of the semiconductor layers 506 is arranged between a lower one of the spacer layers 502 and an upper one of the spacer layers 502. In some embodiments, the semiconductor layers 506 comprise the first semiconductor material, and the spacer layers 502 comprise a second semiconductor material that is different than the first semiconductor material. For example, in some embodiments, the first semiconductor material may comprise silicon, whereas the second semiconductor material may comprise germanium or silicon germanium. In some embodiments, the semiconductor layers 506 and the spacer layers 502 are formed by an epitaxy growth process.

Further, in some embodiments, the semiconductor layers 506 have a fourth thickness $t_4$, and the spacer layers 502 have a fifth thickness $t_5$. In some embodiments, the spacer layers 502 are removed, and the semiconductor layers 506 eventually are formed into nanosheet channel structures (e.g., see, 202, 204, 206 of FIG. 15). Thus, the fifth thickness $t_5$ of the spacer layers 502 may determine the spacing of the nanosheet channel structures (e.g., see, 202, 204, 206 of FIG. 15). In some embodiments, the fourth thickness $t_4$ may be in a range of between, for example, approximately 4 nanometers and approximately 8 nanometers. In some embodiments, the fifth thickness $t_5$ may be in a range of between, for example, approximately 8 nanometers and approximately 15 nanometers. It will be appreciated that other values for the fourth and fifth thicknesses $t_4$, $t_5$ are also within the scope of this disclosure. Further, in some embodiments, a topmost layer of the stack of semiconductor layers 501 may be one of the spacer layers 502 to protect the semiconductor layers 506 during future processing steps. In some embodiments, it will be appreciated that although four semiconductor layers 506 are illustrated in the perspective view 500 of FIG. 5, the number of semiconductor layers 506 in the stack of semiconductor layers 501 may be less than or greater than four.

Figure 6:
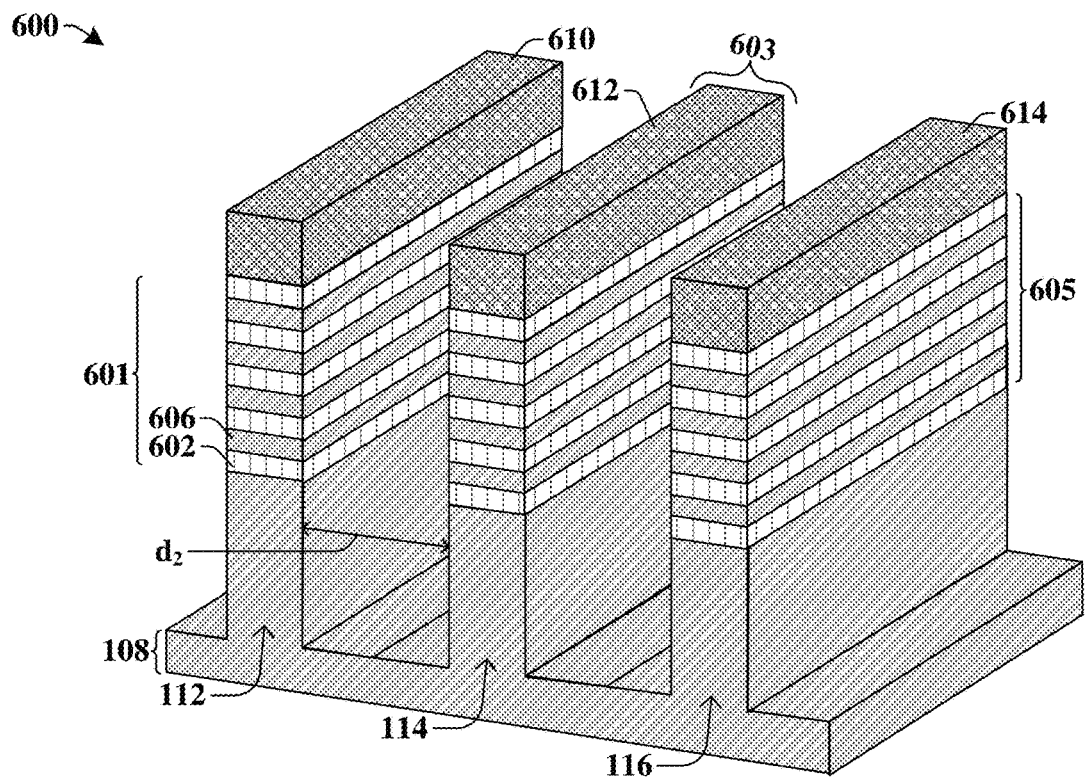

As shown in perspective view 600 of FIG. 6, in some embodiments, a first masking structure 610, a second masking structure 612, and a third masking structure 614 are arranged over the stack of semiconductor layers (501 of FIG. 5). In some embodiments, the first, second, and third masking structures 610, 612, 614 may be formed using photolithography and removal (e.g., etching) processes. In some embodiments, the first, second, and third masking structures 610, 612, 614 may comprise photoresist materials or hard mask materials.

Further, as shown in perspective view 600 of FIG. 6, in some embodiments, a first removal process may be performed according to the first, second, and third masking structures 610, 612, 614 to form a first fin structure 112, a second fin structure 114, and a third fin structure 116 from the substrate 108. In some embodiments, the first removal process may be or comprise a dry, vertical etch. The first fin structure 112, the second fin structure 114, and the third fin structure 116 are continuously connected to one another through the substrate 108. The first fin structure 112, the second fin structure 114, and the third fin structure 116 directly underlie the first masking structure 610, the second masking structure 612, and the third masking structure 614, respectively. In some embodiments, the first fin structure 112 is spaced apart from the second fin structure 114 by a second distance $d_2$, and the second fin structure 114 is spaced apart from the third fin structure 116 by the second distance $d_2$. In some embodiments, the second distance $d_2$ may be in a range of between, for example, approximately 10 nanometers and approximately 50 nanometers.

In some embodiments, the first removal process removes portions of the semiconductor layers (506 of FIG. 5) and the spacer layers (502 of FIG. 5) that are uncovered by the first, second, and third masking structures 610, 612, 614. Therefore, after the first removal process, a first stack of semiconductor layers 601 comprising patterned spacer layers 602 and patterned semiconductor layers 606 is arranged over the first fin structure 112; a second stack of semiconductor layers 603 comprising patterned spacer layers 602 and patterned semiconductor layers 606 is arranged over the second fin structure 114; and a third stack of semiconductor layers 605 comprising patterned spacer layers 602 and patterned semiconductor layers 606 is arranged over the third fin structure 116. It will be appreciated that in other embodiments, more or less than three nanosheet field effect transistors (NSFETs) may be formed, and thus, more or less than the first, second, and third masking structures 610, 612, 614 may be used.

Figure 7:
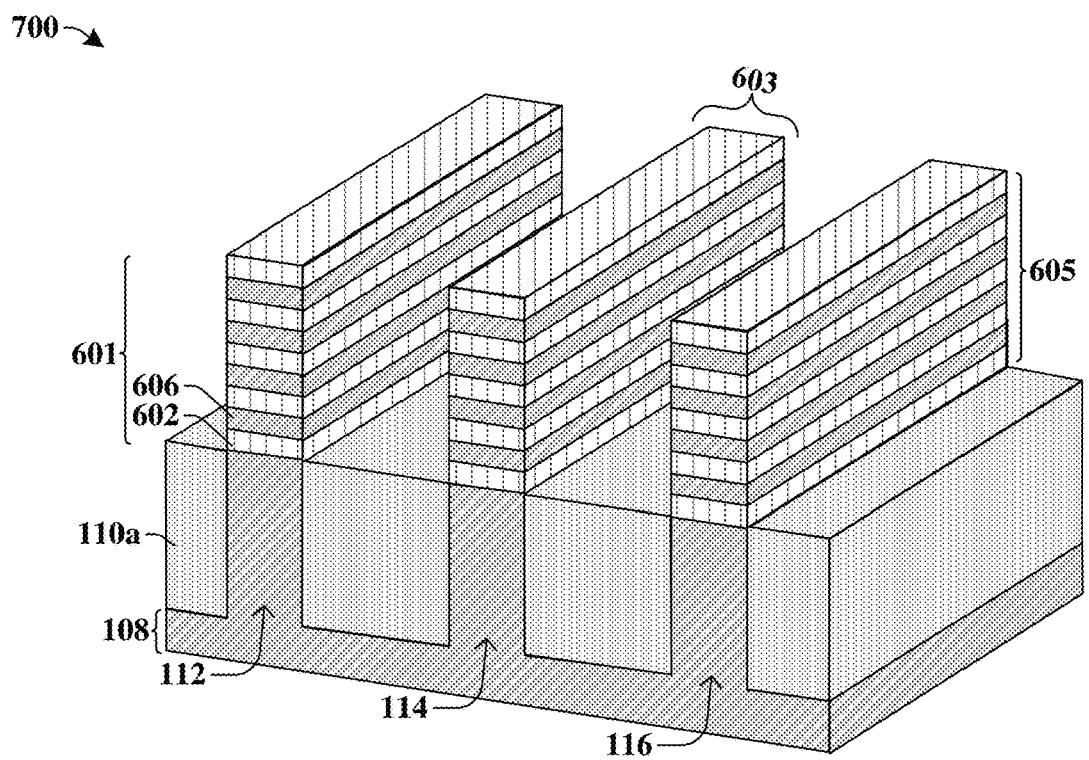

As shown in perspective view 700 of FIG. 7, in some embodiments, a lower isolation structure 110a may be formed over the substrate 108 and between the first, second, and third fin structures 112, 114, 116. The lower isolation structure 110a may provide electrical isolation between the first, second, and third fin structures 112, 114, 116, in some embodiments. In some embodiments, the lower isolation structure 110a may comprise a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

In some embodiments, the lower isolation structure 110a is formed through various steps comprising a thermal oxidation or deposition process (e.g., physical vapor deposition (PVD), chemical vapor deposition (CVD), PE-CVD, atomic layer deposition (ALD), sputtering, etc.), and removal processes (e.g., wet etching, dry etching, chemical mechanical planarization (CMP), etc.). For example, in some embodiments, a dielectric material is deposited over the substrate 108 and the first, second, and third masking structures (610, 612, 614 of FIG. 6). Then, in some embodiments, a removal process, such as CMP, is used to remove portions of the dielectric material and the first, second, and third masking structures (610, 612, 614 of FIG. 6), thereby exposing the first, second, and third stacks of semiconductor layers 601, 603, 605. Then, in some embodiments, another removal process, such as a vertical, dry etch, may be performed to remove portions of the dielectric material surrounding the first, second, and third stacks of semiconductor layers 601, 603, 605 to form the lower isolation structure 110a. It will be appreciated that other processes and/or order of steps to form the lower isolation structure 110a are also within the scope of the disclosure.

Figure 8:
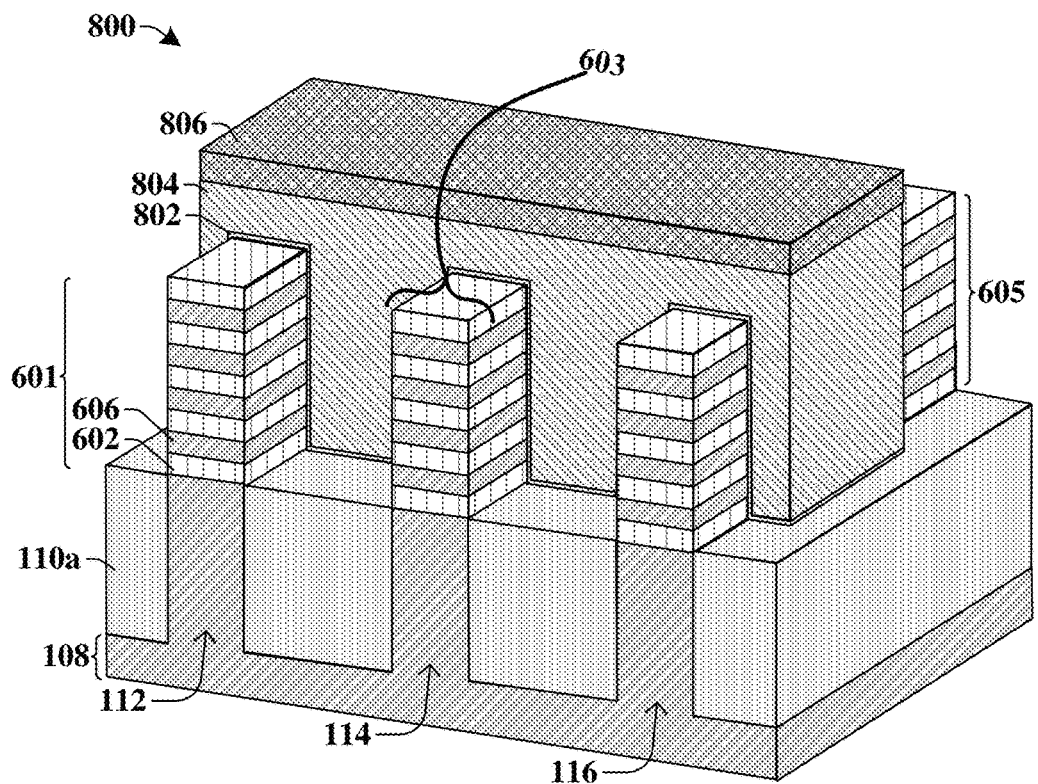

As shown in perspective view 800 of FIG. 8, a dummy gate structure 804 may be formed over the first, second, and third stacks of semiconductor layers 601, 603, 605. In some embodiments, a dummy interfacial layer 802 separates the first, second, and third stacks of semiconductor layers 601, 603, 605 from the dummy gate structure 804, and a fourth masking structure 806 is arranged over the dummy gate structure 804. In some embodiments, to form the dummy gate structure 804, a dummy interfacial material of the dummy interfacial layer 802 is first formed over the first, second, and third stacks of semiconductor layers 601, 603, 605. In some embodiments, the dummy interfacial layer 802 may comprise, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material of the dummy gate structure 804, such as, for example, polysilicon, is formed over the dummy interfacial material. The dummy gate material and/or the dummy interfacial material may be formed by way of a thermal oxidation process and/or a deposition process (e.g., PVD, CVD, PE-CVD, ALD, etc.). In some embodiments, the fourth masking structure 806 is formed over the dummy gate material and directly overlies the first, second, and third stacks of semiconductor layers 601, 603, 605. In some embodiments, the fourth masking structure 806 may be formed using photolithography and removal (e.g., etching)

processes. In some embodiments, the fourth masking structure 806 may comprise photoresist materials or hard mask materials. After the formation of the fourth masking structure 806, a removal process (e.g., etching) may be performed to remove portions of the dummy gate material and the dummy interfacial material that do not directly underlie the fourth masking structure 806, thereby forming the dummy gate structure 804 and the dummy interfacial layer 802, respectively.

Figure 9:
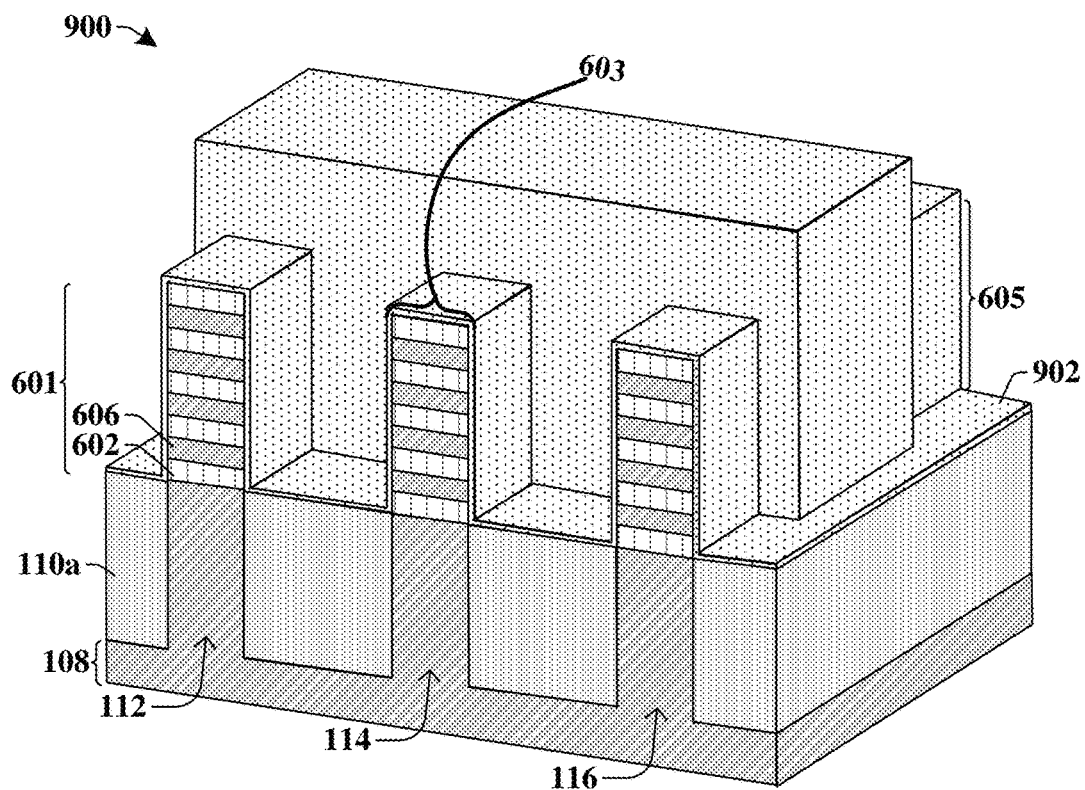

As shown in perspective view 900 of FIG. 9, in some embodiments, a gate spacer layer 902 may be formed over the lower isolation structure 110a, the first stack of semiconductor layers 601, the second stack of semiconductor layers 603, the third stack of semiconductor layers 605, and the dummy gate structure (804 of FIG. 8). In some embodiments, the gate spacer layer 902 may be or comprise a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, in some embodiments, the gate spacer layer 902 may be deposited by way of a deposition process (e.g., PVD, CVD, PE-CVD, ALD, sputtering, etc.). It will be appreciated that other materials and/or ways of forming the gate spacer layer 902 are also within the scope of the disclosure.

Figure 10:
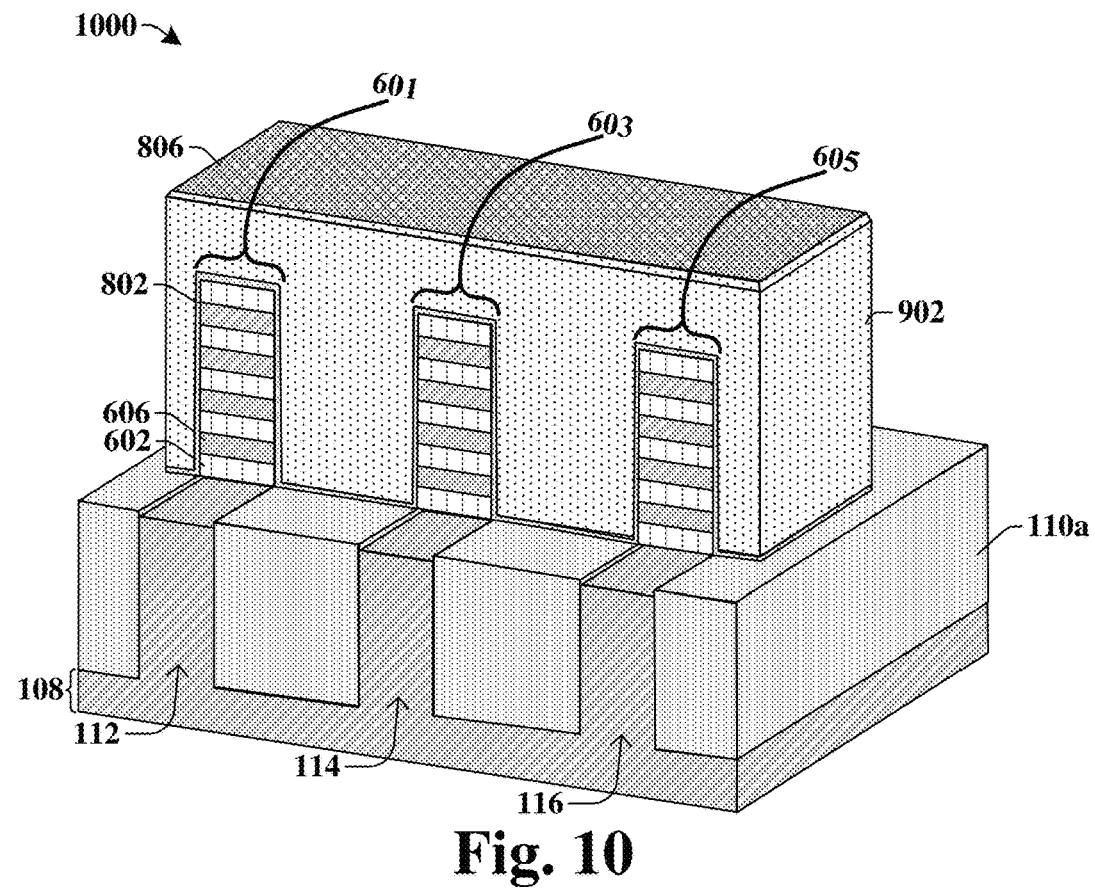

As shown in perspective view 1000 of FIG. 10, in some embodiments, a second removal process may be performed to remove portions of the gate spacer layer 902, the first stack of semiconductor layers 601, the second stack of semiconductor layers 603, and the third stack of semiconductor layers 605 that do not directly underlie the fourth masking structure 806. In some embodiments, the second removal process may be or comprise an etching process. In some embodiments, a single etchant may be used to remove the gate spacer layer 902, the first stack of semiconductor layers 601, the second stack of semiconductor layers 603, and the third stack of semiconductor layers 605, whereas in other embodiments, multiple etchants may be used to perform the second removal process. After the second removal process, the first fin structure 112, the second fin structure 114, and the third fin structure 116 are exposed. In some embodiments, upper portions of the lower isolation structure 110a, the first fin structure 112, the second fin structure 114, the third fin structure 116, and/or the fourth masking structure 806 may be residually removed by the second removal process. Thus, in some embodiments, after the second removal process, the first fin structure 112, the second fin structure 114, and the third fin structure 116 may have upper surfaces below an upper surface of the lower isolation structure 110a.

Figure 11:
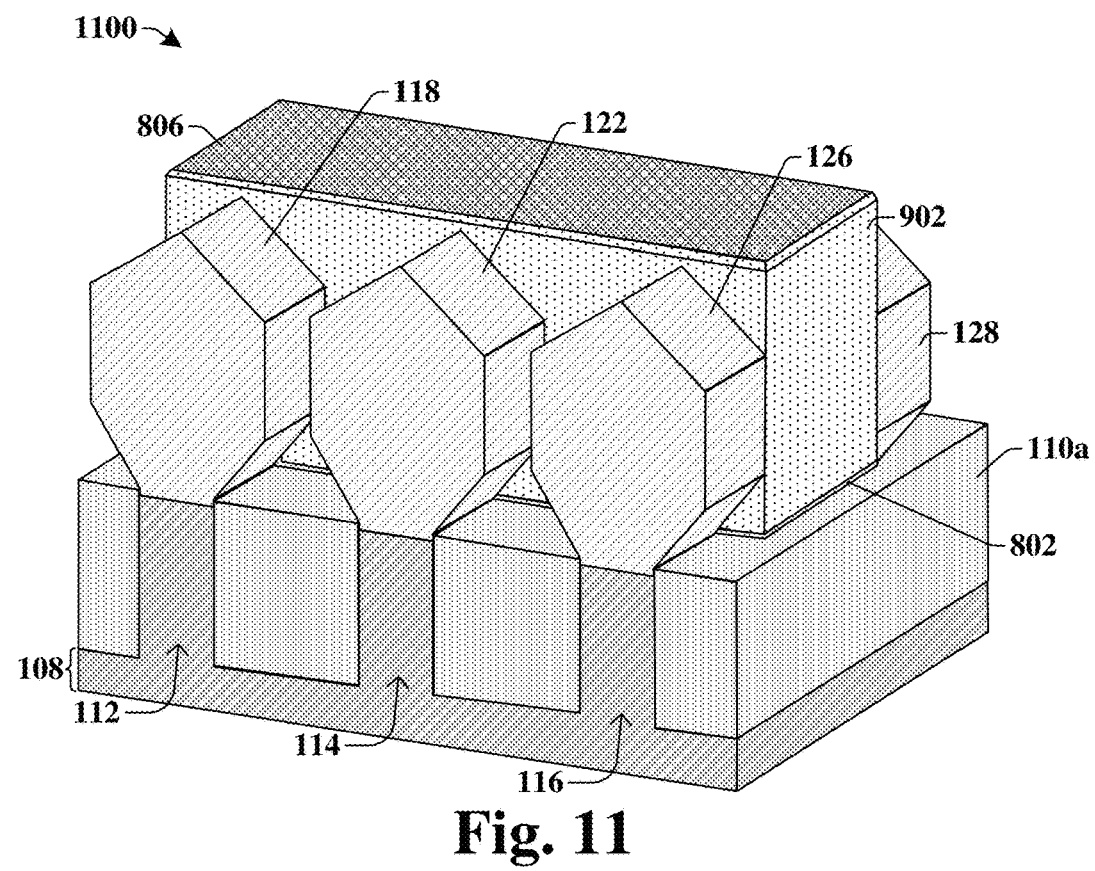

As shown in perspective view 1100 of FIG. 11, in some embodiments, an epitaxial growth process may be performed to form a first source/drain region 110 and a second source/drain region (not shown) on the first fin structure 112, to form a third source/drain region 122 and a fourth source/drain region (not shown) on the second fin structure 114, and to form a fifth source/drain region 126 and a sixth source/drain region 128 on the third fin structure 116. The first source/drain region 118, the second source/drain region (not shown), the third source/drain region 122, the fourth source/drain region (not shown), the fifth source/drain region 126, and the sixth source/drain region 128 may comprise a third semiconductor material. In some embodiments, the third semiconductor material may be doped silicon, for example. In some embodiments, the first source/drain region 118 and the second source/drain region (not shown) may have a first doping type and first doping concentration, the third source/drain region 122 and the fourth source/drain region (not shown) may have a second doping type and second doping concentration, and the fifth source/drain region 126 and the sixth source/drain region 128 may have a third doping type and third doping concentration. Thus, in some embodiments, the first, second, and/or third doping types may be the same or different from one another. In some embodiments, due to the epitaxial growth process, the first source/drain region 118, the second source/drain region (not shown), the third source/drain region 122, the fourth source/drain region (not shown), the fifth source/drain region 126, and the sixth source/drain region 128 may exhibit a hexagonal shape, a diamond shape, or some other geometric shape. Further, in some embodiments, the first source/drain region 118, the second source/drain region (not shown), the third source/drain region 122, the fourth source/drain region (not shown), the fifth source/drain region 126, and the sixth source/drain region 128 do not directly contact one another.

Figure 12:
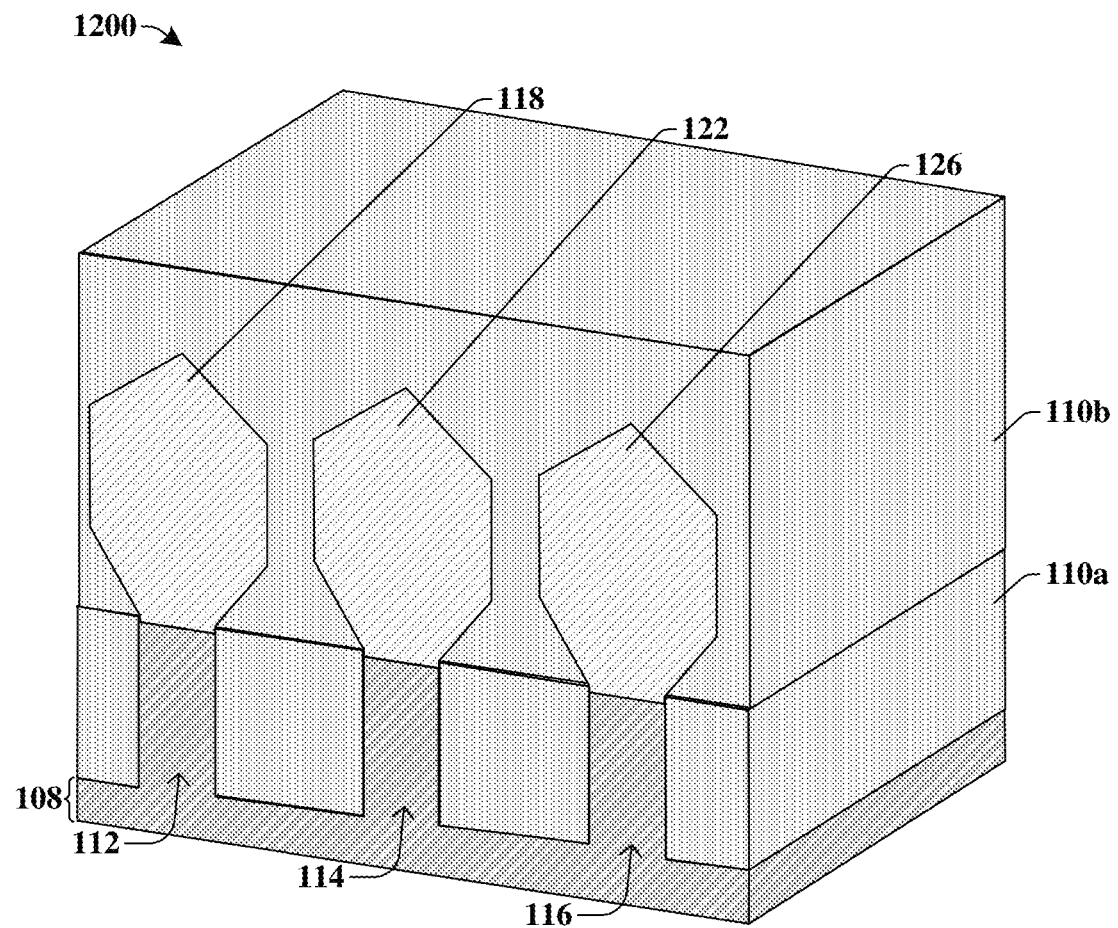

As shown in the perspective view 1200 of FIG. 12, in some embodiments, an upper isolation structure 110b is formed over the lower isolation structure 110a, the first source/drain region 118, the second source/drain region (not shown), the third source/drain region 122, the fourth source/drain region (not shown), the fifth source/drain region 126, and the sixth source/drain region (not shown). In some embodiments, the upper isolation structure 110b comprises a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. The upper isolation structure 110b may provide electrical isolation between first source/drain region 118, the second source/drain region (not shown), the third source/drain region 122, the fourth source/drain region (not shown), the fifth source/drain region 126, and the sixth source/drain region (not shown), in some embodiments. In some embodiments, the upper isolation structure 110b is formed by way of a deposition process (e.g., PVD, CVD, PE-CVD, ALD, sputtering, etc.). Further, in some embodiments, prior to the formation of the upper isolation structure 110b, an etch stop layer (not shown) may be formed over the lower isolation structure 110a, first source/drain region 118, the second source/drain region (not shown), the third source/drain region 122, the fourth source/drain region (not shown), the fifth source/drain region 126, and the sixth source/drain region (not shown).

Figure 13:
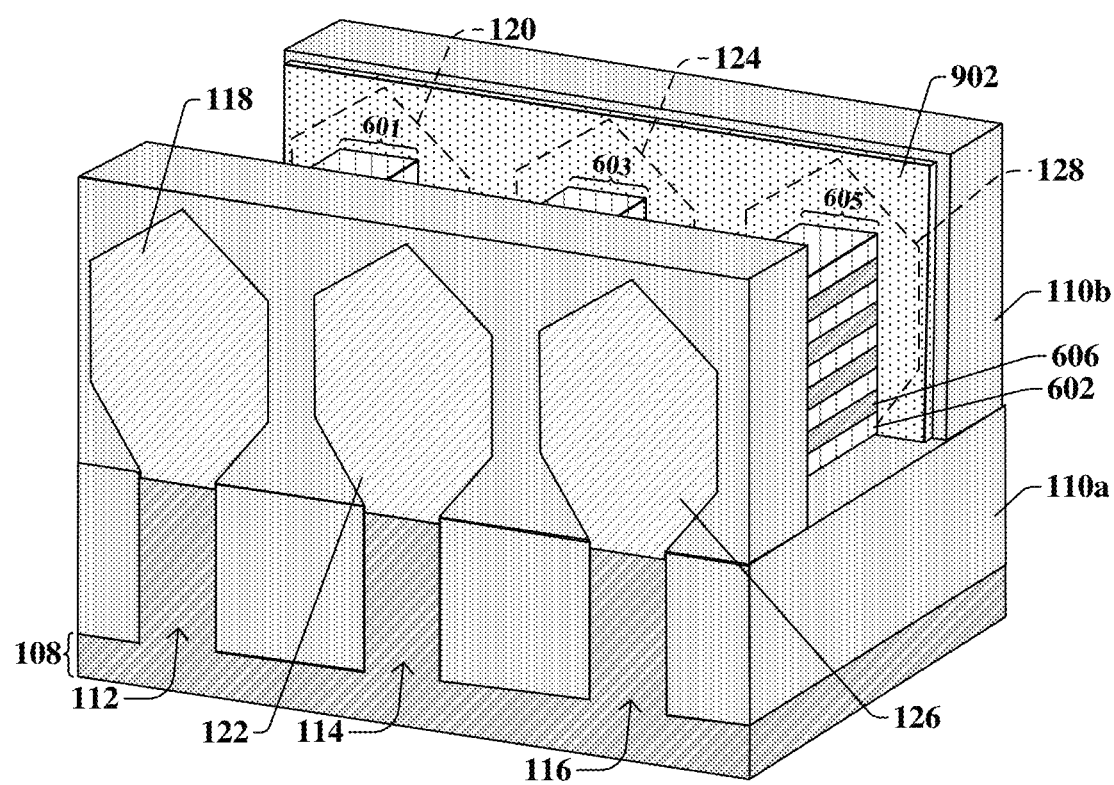

As shown in perspective view 1300 of FIG. 13, in some embodiments, a third removal process is performed to remove the fourth masking structure (806 of FIG. 8), the dummy gate structure (804 of FIG. 8), and the dummy interfacial layer (802 of FIG. 8) from the first stack of semiconductor layers 601, the second stack of semiconductor layers 603, and the third stack of semiconductor layers 605. In some embodiments, the third removal process comprises a CMP step and/or an etching step. For example, in some embodiments, the third removal process first includes a CMP step to remove upper portions of the upper isolation structure 110b and to completely remove the fourth masking structure (806 of FIG. 8) to expose the dummy gate structure (804 of FIG. 8). In some embodiments, the third removal process further includes performing an etching step to completely remove the dummy gate structure (804 of FIG. 8) to expose the first stack of semiconductor layers 601, the second stack of semiconductor layers 603, and the third stack of semiconductor layers 605. It will be appreciated that the second source/drain region 120, the fourth source/drain region 124, and the sixth source/drain region 128 are arranged behind the gate spacer layer 902 and thus, are illustrated with dotted lines.

Figure 14:
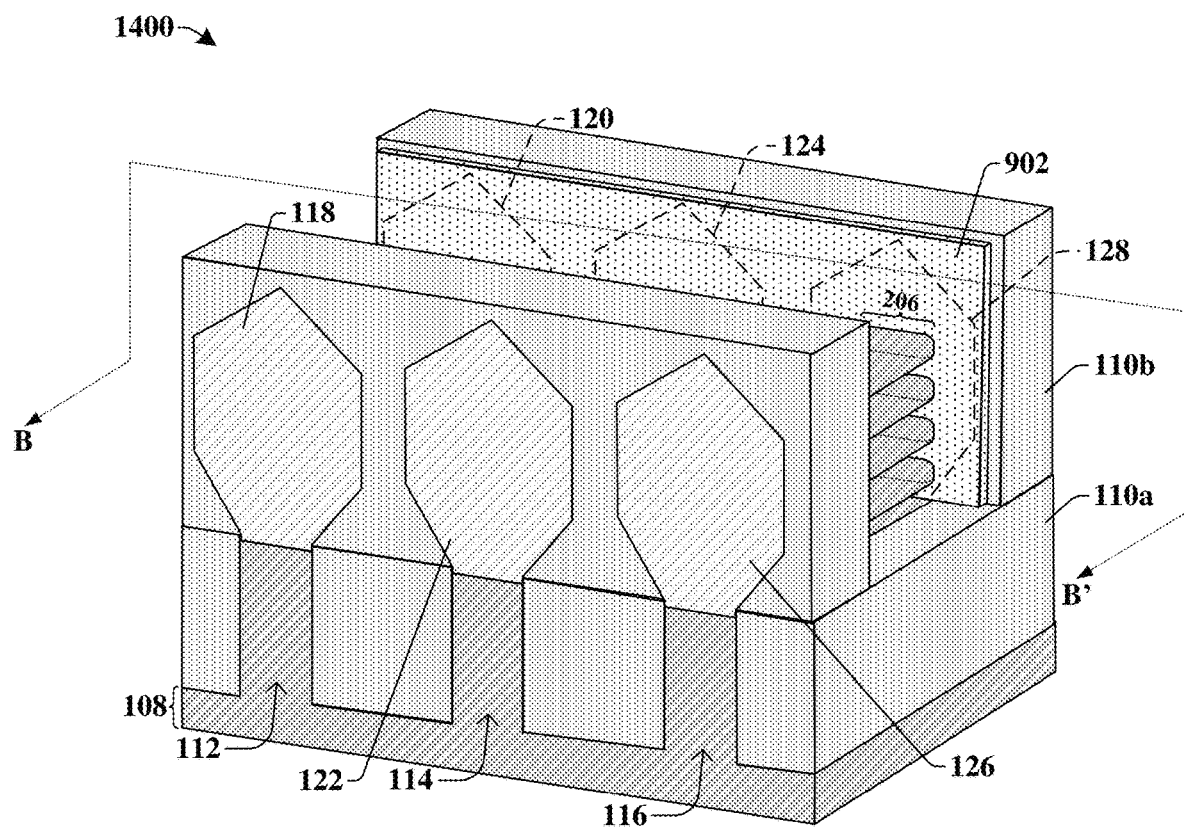

As shown in perspective view 1400 of FIG. 14, in some embodiments, a fourth removal process is performed to remove the patterned spacer layers (602 of FIG. 13) from the first, second, and third stacks of semiconductor layers (601, 603, 605 of FIG. 13). In some embodiments, the fourth removal process comprises an isotropic etching step such that the patterned spacer layers (602 of FIG. 13) from the first, second, and third stacks of semiconductor layers (601, 603, 605 of FIG. 13) can be completely removed from between the patterned semiconductor layers (606 of FIG. 13). In some embodiments, the fourth removal process may comprise a wet etchant or a dry etchant. After the fourth removal process, in some embodiments, first nanosheet channel structures (see, 202 of FIG. 15) comprising the patterned semiconductor layers (606 of FIG. 13) extend from the first source/drain region 118 to the second source/drain region 120; second nanosheet channel structures (see, 204 of FIG. 15) comprising the patterned semiconductor layers (606 of FIG. 13) extend from the third source/drain region 122 to the fourth source/drain region 124; and third nanosheet channel structures 206 comprising the patterned semiconductor layers (606 of FIG. 13) extend from the fifth source/drain region 126 to the sixth source/drain region 128.

Figure 15:
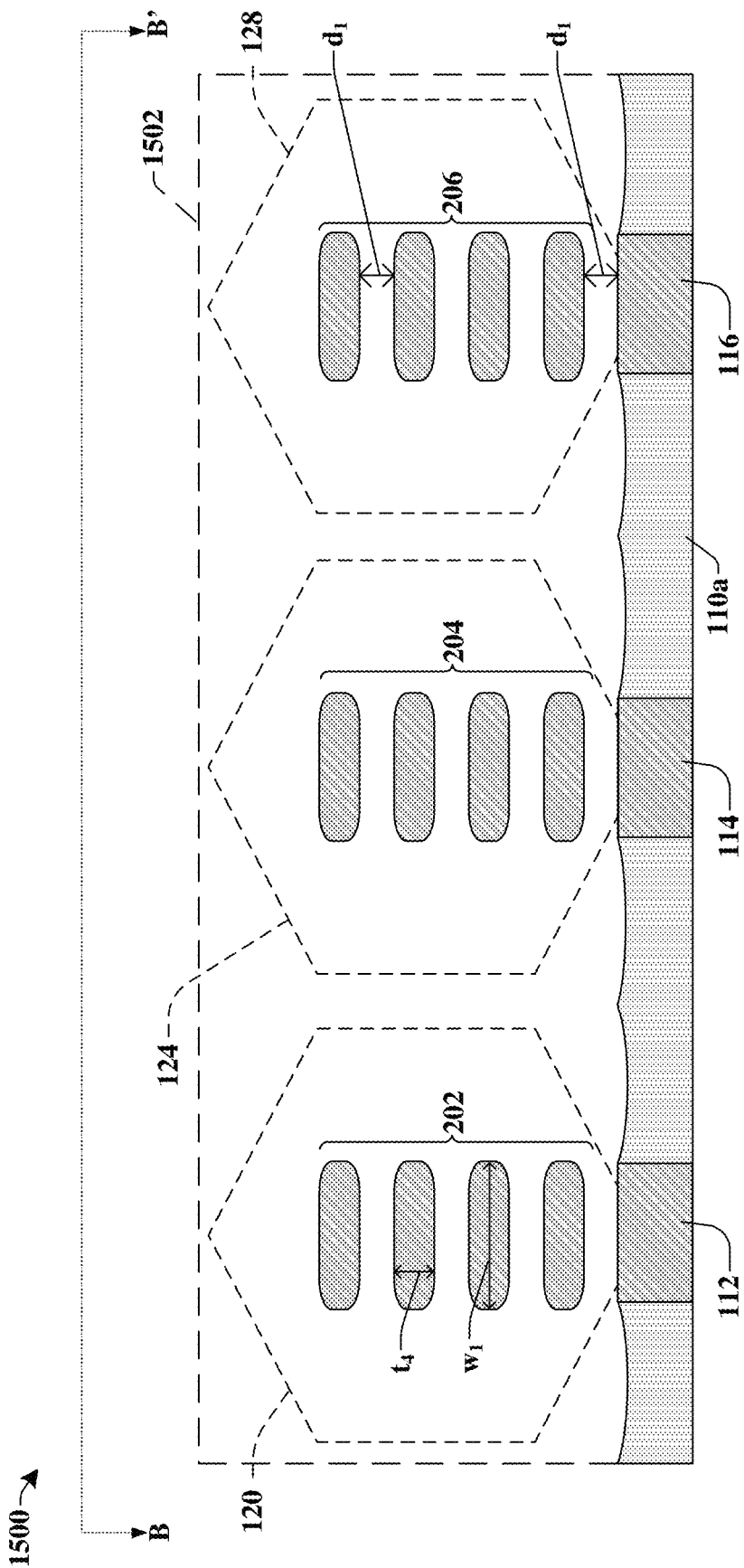

FIG. 15 illustrates a cross-sectional view 1500 of some embodiments that may correspond to cross-section line BB' of FIG. 14.

As shown in the cross-sectional view 1500 of FIG. 15, in some embodiments, after the fourth removal process, first nanosheet channel structures 202 are arranged directly over the first fin structure 112; second nanosheet channel structures 204 are arranged directly over the second fin structure 114; and third nanosheet channel structures 206 are arranged directly over the third fin structure 116. In the cross-sectional view 1500 of FIG. 15, each of the first, second, and third nanosheet channel structures 202, 204, 206 exhibit an elongated oval-like shape or rectangular shape with rounded corners. In some embodiments, the rounded corners are a result of the fourth removal process. In other embodiments, the first, second, and third nanosheet channel structures 202, 204, 206 may exhibit a circle, square, rectangle, hexagon, oval, diamond, or some other shape from the cross-sectional view 1500 after the fourth removal process.

In some embodiments, each of the first nanosheet channel structures 202, the second nanosheet channel structures 204, and the third nanosheet channel structures 206 are vertically spaced apart from one another by a first distance $d_1$. For example, the first distance $d_1$ is the distance between an upper surface of a lowermost one of the first nanosheet channel structures 202 and a lower surface of a second lowermost one of the first nanosheet channel structures 202, wherein the second lowermost one of the first nanosheet channel structures 202 is nearest neighbors with the lowermost one of the first nanosheet channel structures 202. In some embodiments, the fifth thickness ($t_5$ of FIG. 5) of the spacer layers (502 of FIG. 5) determines the first distance $d_1$. Thus, in some embodiments, the first distance $d_1$ may be in a range of between, for example, approximately 8 nanometers and approximately 15 nanometers. Further, in some embodiments, each of the first, second, and third nanosheet channel structures 202, 204, 206 have the fourth thickness $t_4$ as determined by the fourth thickness $t_4$ of the semiconductor layers (506 of FIG. 5). Thus, in some embodiments, the fourth thickness $t_4$ of the first, second, and third nanosheet channel structures 202, 204, 206 is in a range of between, approximately 4 nanometers and approximately 8 nanometers, for example. In some embodiments, each of the first, second, and third nanosheet channel structures 202, 204, 206 may have a first width $w_1$ that is in a range of between, for example, approximately 10 nanometers and approximately 70 nanometers. It will be appreciated that other values for the first distance $d_1$, the fourth thickness $t_4$, and the first width $w_1$ are also within the scope of the disclosure.

It will be appreciated that for ease of illustration, a generic layer 1502 is illustrated behind the first, second, and third nanosheet channel structures 202, 204, 206 and in front of the second, fourth, and sixth source/drain regions 120, 124, 128. For example, from the perspective view 1400 of FIG. 14, it can be understood that the generic layer 1502 represents the gate spacer layer 902, in some embodiments. The generic layer 1502 is illustrated as a white box with a hashed outline. This way, in future processing steps, layers formed around the first, second, and third nanosheet channel structures 202, 204, 206 may be more easily visible.

Figure 16:
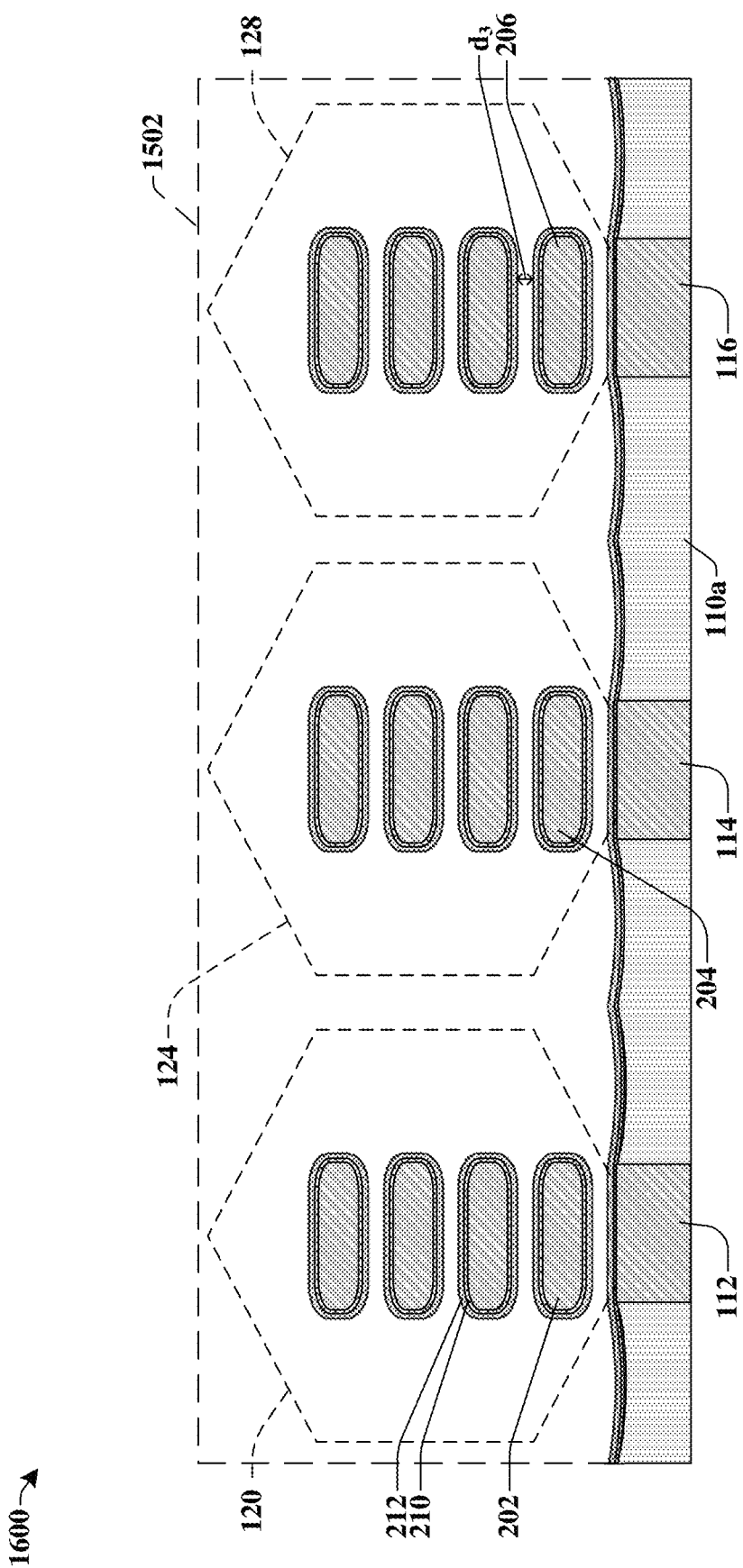

As shown in cross-sectional view 1600 of FIG. 16, in some embodiments, an interfacial layer 210 is formed over the first, second, and third fin structures 112, 114, 116 and around each nanosheet channel structure of the first, second, and third nano sheet channel structures 202, 204, 206. In some embodiments, the interfacial layer 210 may comprise, for example, an oxide such as silicon dioxide. In such embodiments, the interfacial layer 210 may be formed by way of a thermal oxidation process or by other deposition processes (e.g., CVD, PVD, PE-CVD, ALD, sputtering, etc.). In some embodiments the interfacial layer 210 may have a thickness in a range of between approximately 8 angstroms and approximately 15 angstroms, for example. In some embodiments, from the cross-sectional view 1600, the interfacial layer 210 may comprise ring-like structures that surround and directly contact each of the first, second, and third nanosheet channel structures 202, 204, 206.

Further, in some embodiments, a gate dielectric layer 212 is formed over the interfacial layer 210. In some embodiments, the gate dielectric layer 212 may comprise a high-k dielectric material, such as, for example, hafnium dioxide, zirconium dioxide, hafnium silicon oxide, or some other suitable dielectric material. In some embodiments, the gate dielectric layer 212 may also comprise lanthanum, magnesium, yttrium, aluminum, niobium, titanium, or some other suitable material used for dipole engineering in the gate dielectric layer 212. For example, in some embodiments of a p-type NSFET, wherein mobile charge carriers are positive (e.g., holes), the gate dielectric layer 212 may comprise aluminum, niobium, or titanium, whereas in embodiment of an n-type NSFET, wherein mobile charge carriers are negative (e.g., electrons), the gate dielectric layer 212 may comprise lanthanum, magnesium, or yttrium. The gate dielectric layer 212 may comprise the same composition on each of the first, second, and third nanosheet channel structures 202, 204, 206, in some embodiments. In some embodiments, the gate dielectric layer 212 may be formed by way of a deposition process (e.g., CVD, PVD, PE-CVD, ALD, sputtering, etc.). In some embodiments the gate dielectric layer 212 may have a thickness in a range of between approximately 10 angstroms and approximately 20 angstroms, for example. In some embodiments, from the cross-sectional view 1600, the gate dielectric layer 212 may also comprise ring-like structures that surround each of the first, second, and third nanosheet channel structures 202, 204, 206. The interfacial layer 210 may separate the gate dielectric layer 212 from directly contacting the first, second, and third nano sheet channel structures 202, 204, 206.

After the formation of the interfacial layer 210 and the gate dielectric layer 212, in some embodiments, a third distance $d_3$ remains between nearest neighboring ring-like structures of the gate dielectric layer 212. Thus, the thickness of the interfacial layer 210 and the thickness of the gate dielectric layer 212 are small enough to allow the third distance $d_3$ to remain between the first, second, and third nanosheet channel structures 202, 204, 206. In some embodiments, the third distance $d_3$ is in a range of between, for example, approximately 4 nanometers and approximately 6 nanometers. It will be appreciated that other values of the third distance $d_3$ are also within the scope of this disclosure.

Figure 17:
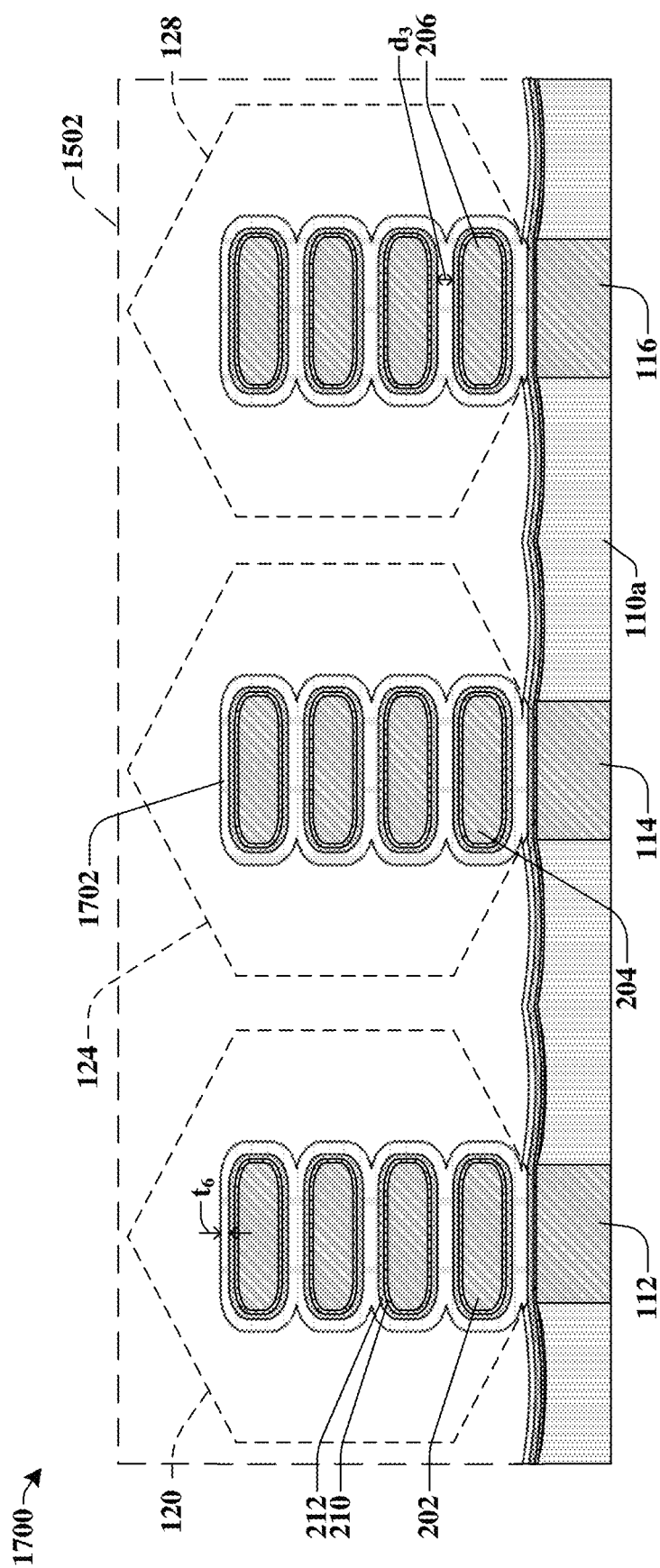

As shown in cross-sectional view 1700 of FIG. 17, in some embodiments, a dummy masking layer 1702 is formed over the first, second, and third fin structures 112, 114, 116 and over and around the first, second, and third nanosheet channel structures 202, 204, 206. In some embodiments, the dummy masking layer 1702 comprises aluminum oxide, titanium nitride, or some other suitable hard mask material. In some embodiments, the dummy masking layer 1702 may be formed by way of a deposition process (e.g., CVD, PVD, PE-CVD, ALD, sputtering, etc.). The dummy masking layer 1702 is formed to completely cover the first fin structure 112, the second fin structure 114, and the third fin structure 116, and to completely surround each of the first, second, and third nanosheet channel structures 202, 204, 206. In some embodiments, the dummy masking layer 1702 has a sixth thickness $t_6$, and the sixth thickness $t_6$ is at least equal to one-half of the third distance $d_3$. Thus, the dummy masking layer 1702 completely fills in the space directly between the nearest first, second, and third nanosheet channel structures 202, 204, 206. The dummy masking layer 1702 also fills in the space directly between the first fin structure 112 and a lowermost one of the first nanosheet channel structures 202, directly between the second fin structure 114 and a lowermost one of the second nanosheet channel structures 204, and directly between the third fin structure 116 and a lowermost one of the third nanosheet channel structures 206.

Figure 18:
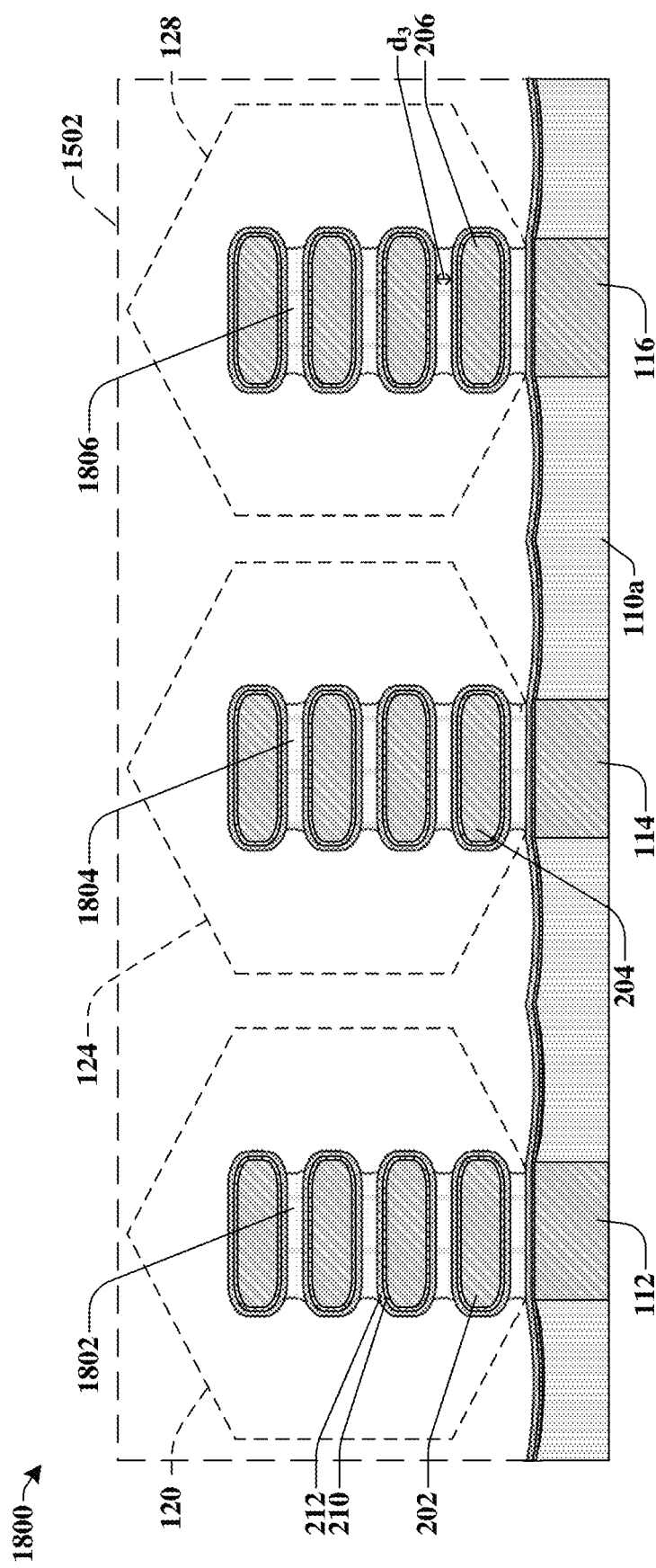

As shown in cross-sectional view 1800 of FIG. 18, in some embodiments, a fifth removal process is performed to remove outer portions of the dummy masking layer (1702 of FIG. 17), thereby forming a first dummy masking structure 1802 directly overlying the first fin structure 112, a second dummy masking structure 1804 directly overlying the second fin structure 114, and a third dummy masking structure 1806 directly overlying the third fin structure 116. Further, the first dummy masking structure 1802, the second dummy masking structure 1804, and the third dummy masking structure 1806 are respectively arranged directly between the first nanosheet channel structures 202, the second nanosheet channel structures 204, and the third nanosheet channel structures 206.

In some embodiments, the fifth removal process may comprise a wet or dry etch. The etchant used for the fifth removal process to form the first, second, and third dummy masking structures 1802, 1804, 1806 selectively removes the material of the dummy masking layer (1702 of FIG. 17) without removing the gate dielectric layer 212. Thus, in some embodiments, the material of the dummy masking layer (1702 of FIG. 17) is a material that may be selectively removed by a certain etchant, while that certain etchant does not remove the material of the gate dielectric layer 212. For example, in some embodiments, the dummy masking layer (1702 of FIG. 17) may comprise aluminum oxide and the etchant of the fifth removal process comprises an ammonium hydroxide solution. It will be appreciated that other materials of the dummy masking layer (1702 of FIG. 17) and etchants are also within the scope of this disclosure. Further, in some embodiments, the fifth removal process is performed for a time period that removes at least the sixth thickness ($t_6$ of FIG. 17) of the dummy masking layer (1702 of FIG. 17) while majority of the dummy masking layer (1702 of FIG. 17) still remains directly between the vertically arranged first, second, and third nanosheet channel structures 202, 204, 206 to form the first, second, and third dummy masking structures 1802, 1804, 1806, respectively.

Figure 19:
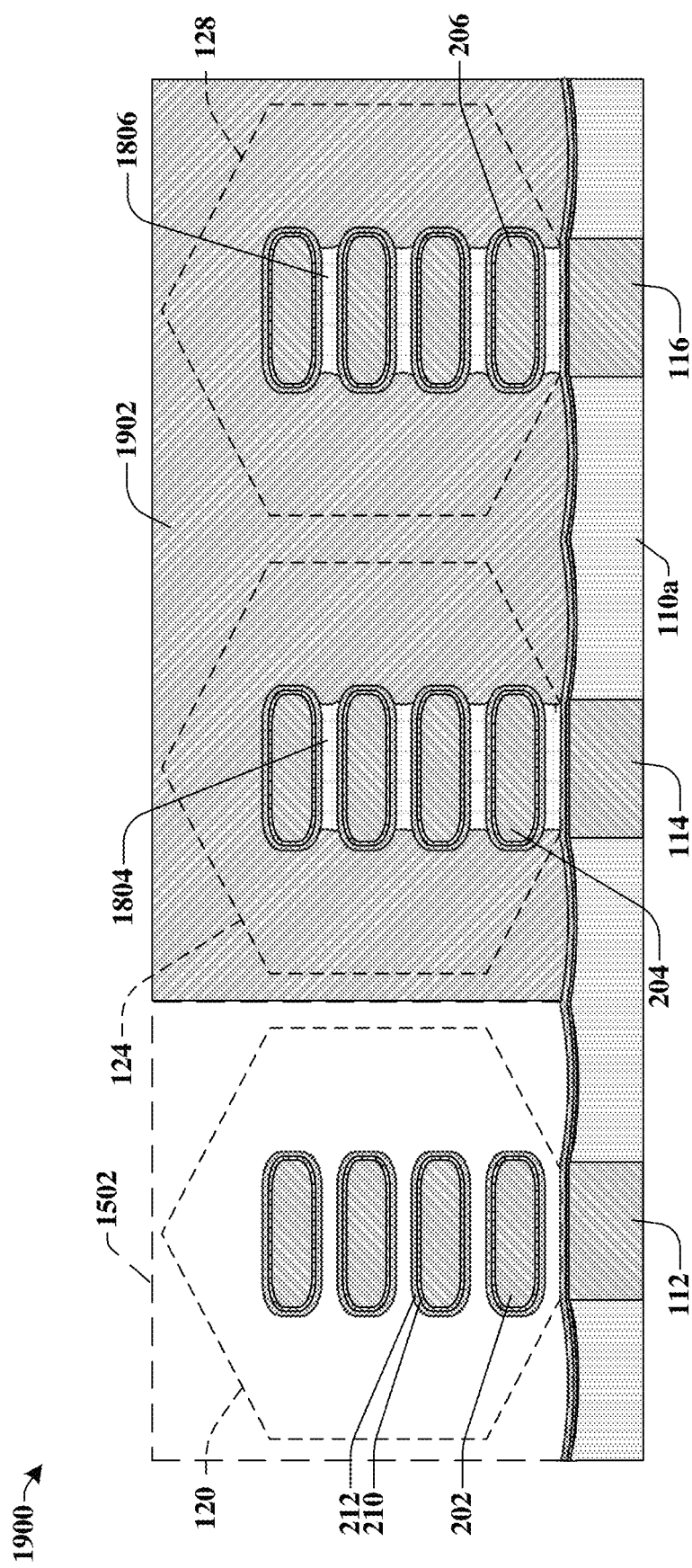

As shown in cross-sectional view 1900 of FIG. 19, in some embodiments, a fifth masking structure 1902 is formed over the second and third fin structures 114, 116 and over the second and third nanosheet channel structures 204, 206. The fifth masking structure 1902 does not directly overlie the first fin structure 112 or the first nanosheet channel structures 202. In some embodiments, the fifth masking structure 1902 may be formed using deposition (e.g., spin-coating), photolithography and removal (e.g., etching) processes. For example, in some embodiments, the fifth masking structure 1902 may be or comprise a bottom anti-reflective coating (BARC), an anti-reflective coating (ARC), or some other suitable photoresist material. In other embodiments, the fifth masking structure 1902 may be or comprise a hard mask material.

After the formation of the fifth masking structure 1902, in some embodiments, a sixth removal process is performed to completely remove the first dummy masking structure (1802 of FIG. 18) that is uncovered by the fifth masking structure 1902. In some embodiments, the sixth removal process may comprise the same etchant as the fifth removal process because the same dummy masking material is being removed without removing the gate dielectric material of the gate dielectric layer 212.

Figure 20:
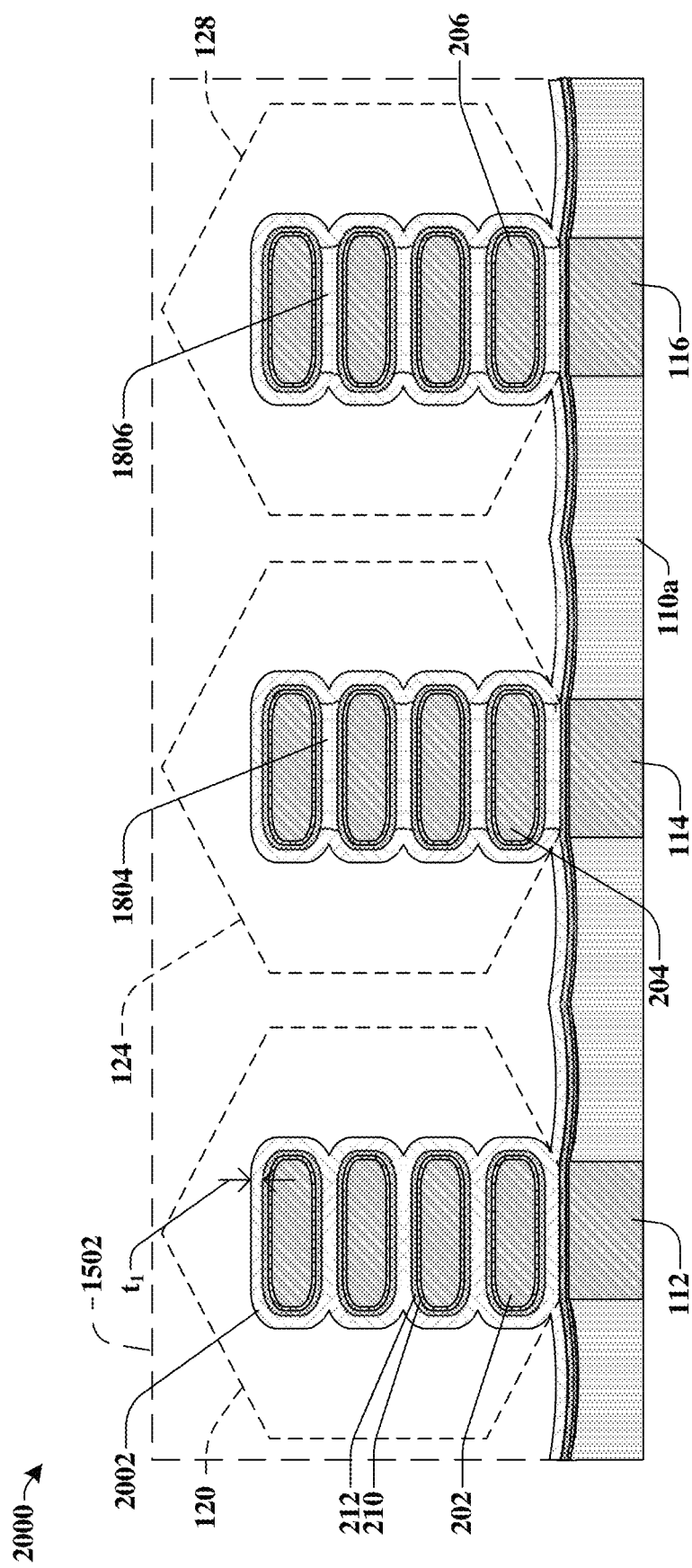

As shown in cross-sectional view 2000 of FIG. 20, in some embodiments, the fifth masking structure (1902 of FIG. 19) is removed, and a first conductive layer 2002 is formed over and completely surrounding each of the first nanosheet channel structures 202 and is formed over the second and third nanosheet channel structures 204, 206. Because of the second dummy masking structure 1804 and the third dummy masking structure 1806, the first conductive layer 2002 does not completely surround each of the second and third nanosheet channel structures 204, 206. In some embodiments, the first conductive layer 2002 is formed to have a first thickness $t_1$. In some embodiments, the first thickness $t_1$ is at least equal to one half of the third distance ($d_3$ of FIG. 16) such that the first conductive layer 2002 is a continuously connected layer from the cross-sectional view 2000 and completely surrounds each of the first nanosheet channel structures 202.

In some embodiments, the first conductive layer 2002 is formed by way of a deposition process (e.g., physical vapor deposition (PVD), chemical vapor deposition (CVD), PE-CVD, atomic layer deposition (ALD), sputtering, etc.). In some embodiments, the first conductive layer 2002 comprises a conductive material that is an n-type work function metal (e.g., titanium aluminum, titanium aluminum carbide, tantalum aluminum carbide, titanium silicon aluminum carbide, etc.), that is a p-type work function metal (e.g., titanium nitride, tungsten carbon nitride, tungsten, tantalum nitride, etc.), or that is a mid-gap type work function metal (e.g., titanium aluminum nitride, titanium silicon nitride, titanium nitride and silicon, etc.). Further, in some embodiments, prior to the formation of the first conductive layer 2002, a passivation layer may be formed surrounding each of the first nanosheet channel structures 202. In such embodiments (not shown), the passivation layer may comprise, for example, titanium nitride, silicon, or some other suitable passivation material.

Figure 21:
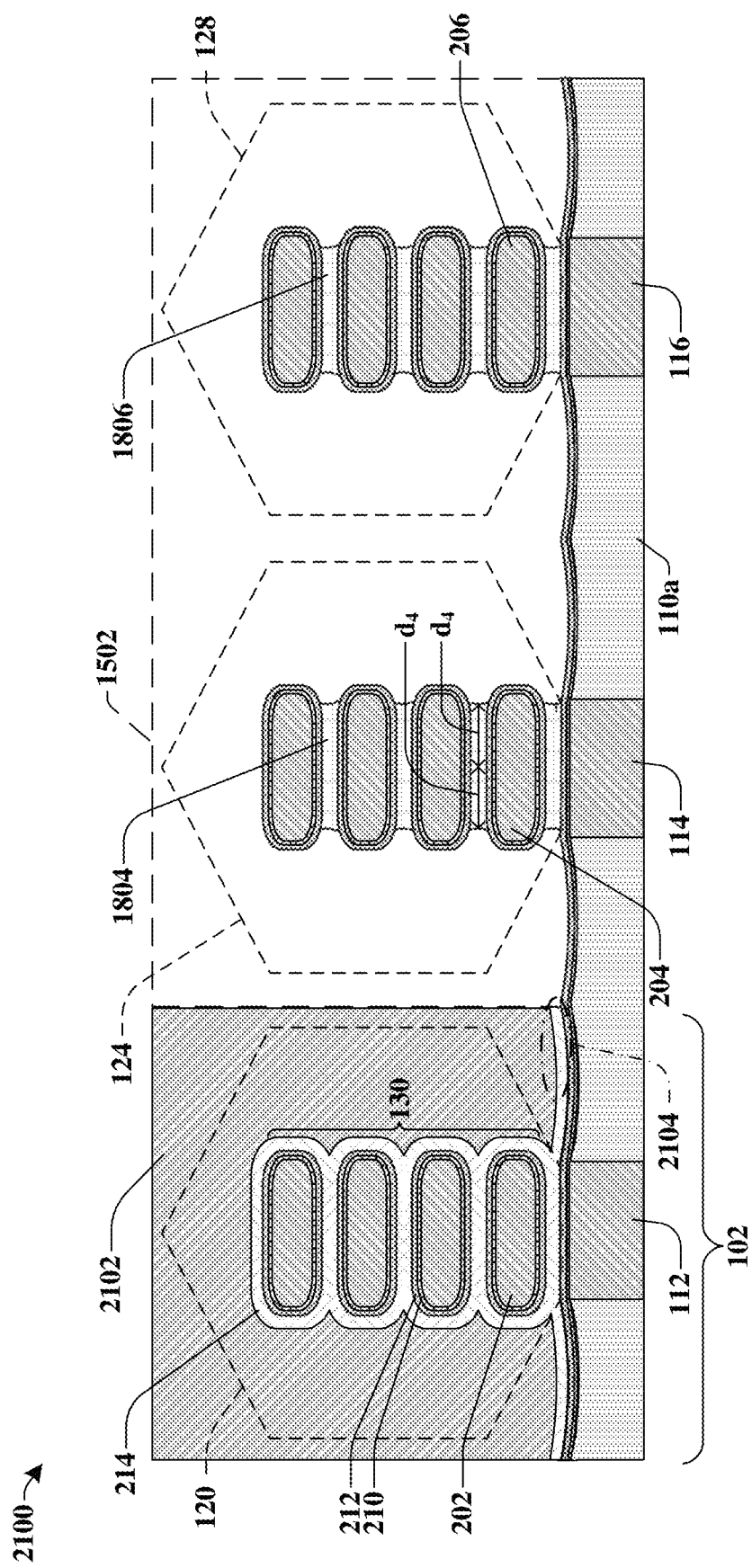

As shown in cross-sectional view 2100 of FIG. 21, in some embodiments, a sixth masking structure 2102 is formed over the first fin structure 112 and the first nanosheet channel structures 202. The sixth masking structure 2102 does not directly overlie the second or third fin structures 114, 116. In some embodiments, the sixth masking structure 2102 may be formed using deposition (e.g., spin-coating), photolithography and removal (e.g., etching) processes. For example, in some embodiments, the sixth masking structure 2102 may be or comprise a bottom anti-reflective coating (BARC), an anti-reflective coating (ARC), or some other suitable photoresist material. In some other embodiments, the sixth masking structure 2102 may be or comprise a hard mask material.

After the formation of the sixth masking structure 2102, in some embodiments, a seventh removal process is performed to remove portions of the first conductive layer (2002 of FIG. 20) that are uncovered by the sixth masking structure 2102 leaving behind a first gate electrode layer 214 over the first fin structure 112. Thus, the seventh removal process completely removes the first conductive layer (2002 of FIG. 20) from the second and third nanosheet channel structures 204, 206. In some embodiments, the seventh removal process comprises a wet or dry etch process. The etchant used by the seventh removal process removes the first conductive layer (2002 of FIG. 20) without removing the second dummy masking structure 1804, the third dummy masking structure 1806, or the gate dielectric layer 212. After the seventh removal process, a first nanosheet field effect transistor (NSFET) 102 is formed comprising the first nanosheet channel structures 202 embedded in a first gate electrode structure 130, wherein the first gate electrode structure 130 includes the first gate electrode layer 214, the gate dielectric layer 212, and the interfacial layer 210. The first NSFET 102 may have a first threshold voltage that is at least influenced by the materials and/or thicknesses of the first gate electrode layer 214 and the gate dielectric layer 212.

During the seventh removal process, the second dummy masking structure 1804 and the third dummy masking structure 1806 reduce a maximum dimension of the first conductive layer (2002 of FIG. 20) to be removed by the seventh removal process by at least a fourth distance $d_4$. In some embodiments, the width of the second and third dummy masking structures 1804, 1806 are equal to two times of the fourth distance $d_4$. In some embodiments, because of the second and third dummy masking structures 1804, 1806, the maximum dimension of the first conductive layer (2002 of FIG. 20) to be removed by the seventh removal process is about equal to the first thickness $t_1$, for example.

In some embodiments, as a result of the reduction in the maximum dimensions of the first conductive layer (2002 of FIG. 20) for removal by the seventh removal process, the etching time(s) of the seventh removal process may be reduced. Then, portions 2104 of the first conductive layer (2002 of FIG. 20) that are arranged directly below the sixth masking structure 2102 and closest to the second fin structure 114 are not exposed to the seventh removal process as long. Therefore, removal of the portions 2104 of the first conductive layer (2002 of FIG. 20) is prevented or at least mitigated. In other embodiments, without the first and second dummy masking structures 1804, 1806, it will be appreciated that over-etching by the seventh removal process could remove portions of the first gate electrode layer 214 arranged below the sixth masking structure 2102, thereby compromising the reliability of the first NSFET 102. Thus, because of the second and third dummy masking structures 1804, 1806, the seventh removal process is quicker and exposure of the portions 2104 of the first conductive layer (2002 of FIG. 20) to the etchant(s) of the seventh removal process is reduced, thereby preventing damage to the first gate electrode structure 130 and corresponding first NSFET 102.

Figure 22:
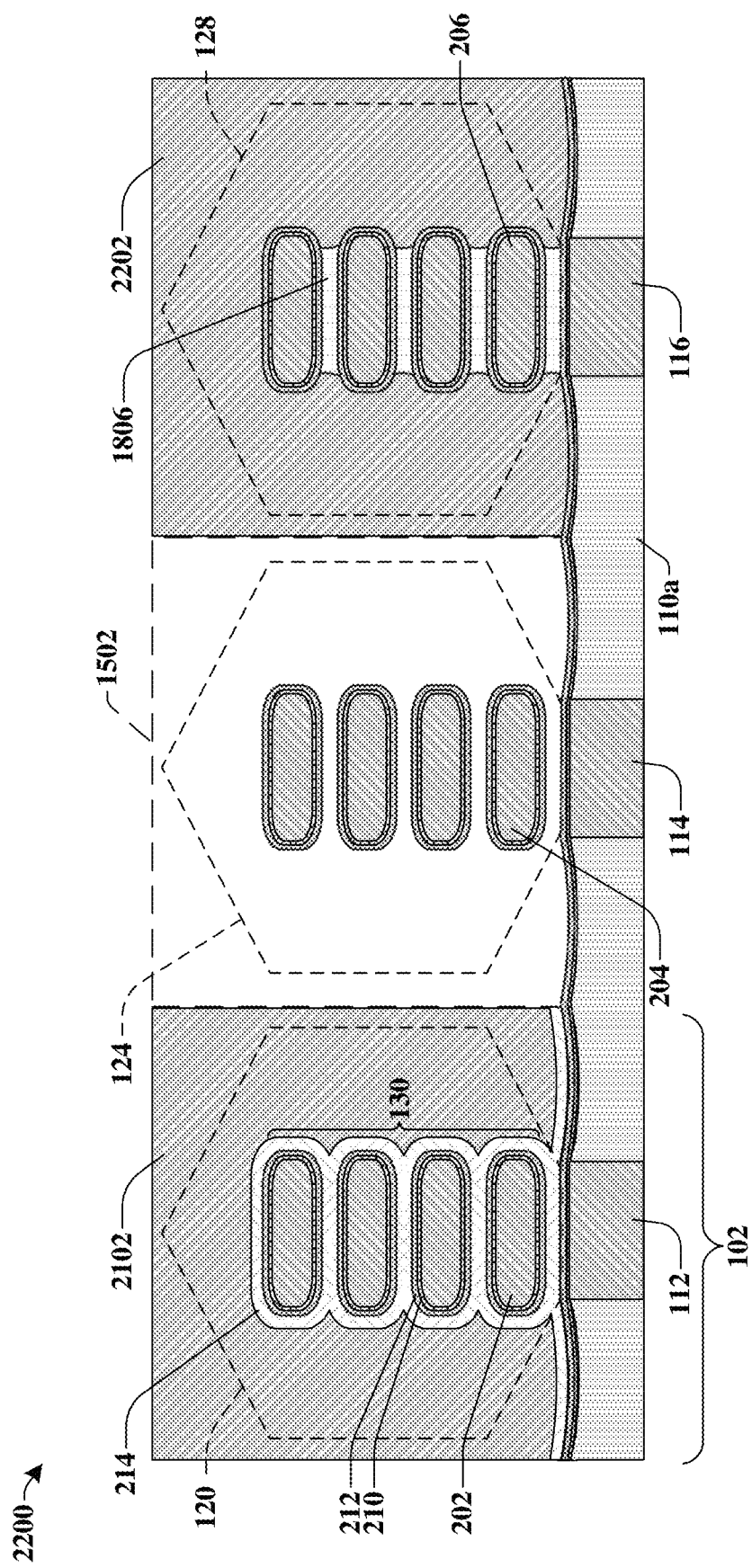

As illustrated in cross-sectional view 2200 of FIG. 22, in some embodiments, a seventh masking structure 2202 is formed over the third fin structure 116 and the third nanosheet channel structures 206. In some embodiments, the sixth masking structure 2102 remains over the first fin structure 112 when the seventh masking structure 2202 is formed, whereas in other embodiments, the sixth masking structure 2102 may be removed, and then the seventh masking structure 2202 may be formed over the first and third fin structures 112, 116. Nevertheless, in the cross-sectional view 2200 of FIG. 22, the first and third fin structures 112, 116 and the first and third nanosheet channel structures 202, 206 are covered by masking structures (e.g., 2102, 2202) while the second fin structure 114 and the second nanosheet channel structures 204 are uncovered.

After the formation of the seventh masking structure 2202, an eighth removal process is conducted to completely remove the second dummy masking structure (1804 of FIG. 21) that is uncovered by the sixth and seventh masking structures 2102, 2202. In such embodiments, the eighth removal process may comprise the same etchant as the sixth removal process because the dummy masking material is being removed without removing the gate dielectric material of the gate dielectric layer 212. Further, the etchant used in the eighth removal process does not remove the material of the first gate electrode layer 214. Therefore, the second dummy masking structure (1804 of FIG. 21) advantageously reduces over-etching of the first conductive layer (2002 of FIG. 20) during the seventh removal process of FIG. 22 without damaging other features (e.g., the first gate electrode layer 214, the gate dielectric layer 212).

Figure 23:
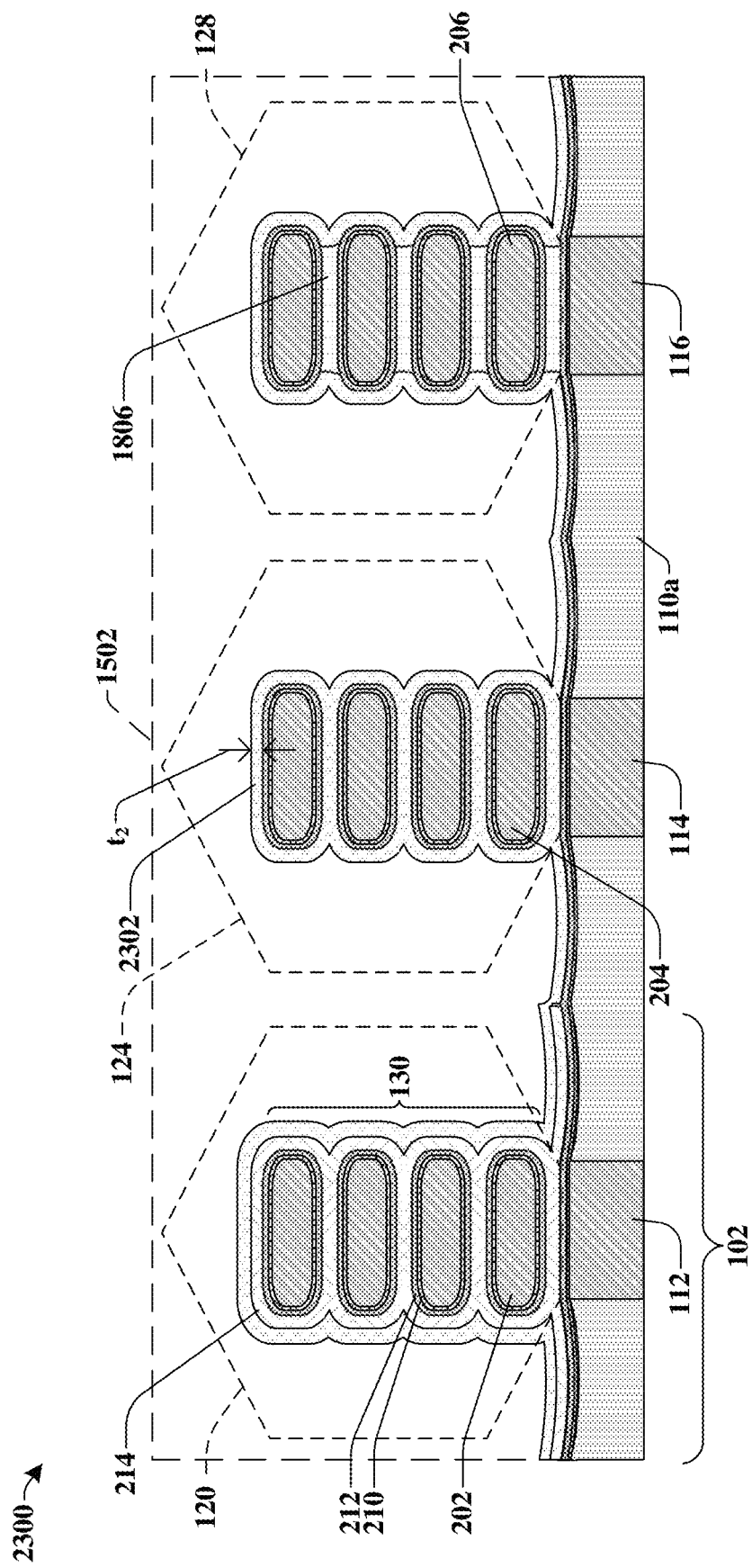

As shown in the cross-sectional view 2300 of FIG. 23, in some embodiments, the sixth and seventh masking structures (2102, 2202 of FIG. 22) are removed, and a second conductive layer 2302 is formed over and completely surrounding each of the second nanosheet channel structures 204 and is formed over the first and third nanosheet channel structures 202, 206. Because of the third dummy masking structure 1806, the second conductive layer 2302 does not completely and continuously surround each of the third nanosheet channel structures 206. In some embodiments, the second conductive layer 2302 is formed to a second thickness $t_2$. In some embodiments, the second thickness $t_2$ is at least equal to one half of the third distance ($d_3$ of FIG. 16) such that the second conductive layer 2302 is a continuously connected layer from the cross-sectional view 2300 and completely surrounds each of the second nanosheet channel structures 204. Further, in some embodiments, the second conductive layer 2302 is formed over outer surfaces of the first gate electrode layer 214. In such embodiments, the second conductive layer 2302 is not arranged directly between the first nanosheet channel structures 202 or directly between a lowermost one of the nanosheet channel structures 202 and the first fin structure 112. In such embodiments, the second conductive layer 2302 does not affect or does not significantly affect the first work function of the first NSFET 102.

In some embodiments, the second conductive layer 2302 is formed by way of a deposition process (e.g., physical vapor deposition (PVD), chemical vapor deposition (CVD), PE-CVD, atomic layer deposition (ALD), sputtering, etc.). In some embodiments, the second conductive layer 2302 comprises a conductive material that is an n-type work function metal (e.g., titanium aluminum, titanium aluminum carbide, tantalum aluminum carbide, titanium silicon aluminum carbide, etc.), that is a p-type work function metal (e.g., titanium nitride, tungsten carbon nitride, tungsten, tantalum nitride, etc.), or that is a mid-gap type work function metal (e.g., titanium aluminum nitride, titanium silicon nitride, titanium nitride and silicon, etc.). Further, in some embodiments, prior to the formation of the second conductive layer 2302, a passivation layer may be formed surrounding each of the second nanosheet channel structures 204. In such embodiments (not shown), the passivation layer may comprise, for example, titanium nitride, silicon, or some other suitable passivation material.

Figure 24:
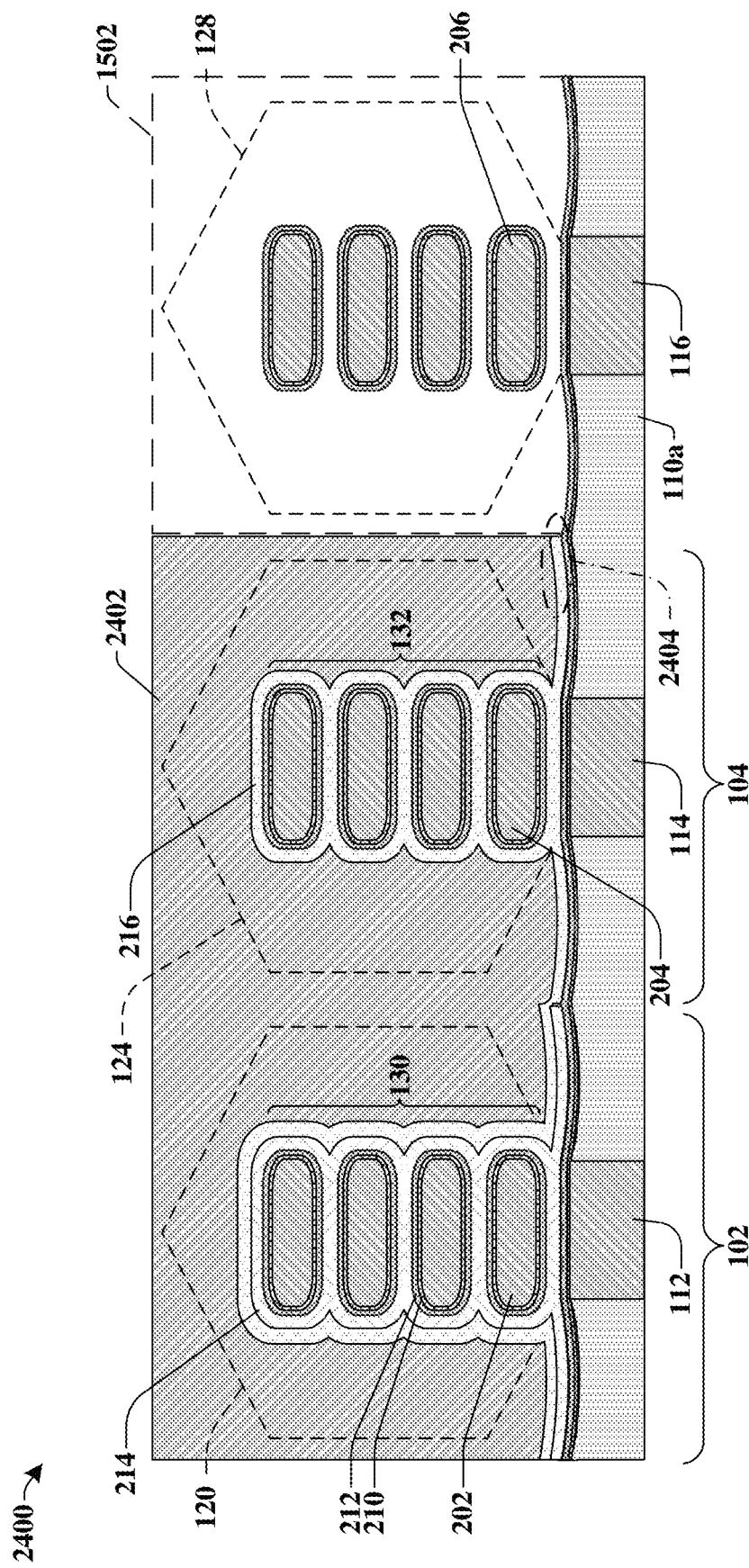

As shown in cross-sectional view 2400 of FIG. 24, in some embodiments, eighth masking structure 2402 is formed over the first and second fin structures 112, 114 and over the first and second nanosheet channel structures 202, 204. The eighth masking structure 2402 does not directly overlie the third fin structure 116. In some embodiments, the eighth masking structure 2402 may be formed using deposition (e.g., spin-coating), photolithography and removal (e.g., etching) processes. For example, in some embodiments, the eighth masking structure 2402 may be or comprise a bottom anti-reflective coating (BARC), an anti-reflective coating (ARC), or some other suitable photoresist material. In some other embodiments, the eighth masking structure 2402 may be or comprise a hard mask material.

After the formation of the eighth masking structure 2402, in some embodiments, a ninth removal process is performed to remove portions of the second conductive layer (2302 of FIG. 23) that are uncovered by the eighth masking structure 2402 thereby forming a second gate electrode layer 216 over the second fin structure 114. Thus, the ninth removal process completely removes the second conductive layer (2302 of FIG. 23) from the third nanosheet channel structures 206. In some embodiments, the ninth removal process comprises a wet or dry etch process. The etchant used by the ninth removal process removes the second conductive layer (2302 of FIG. 23) without removing the gate dielectric layer 212. Further, in some embodiments, the ninth removal process does not remove the third dummy masking structure (1806 of FIG. 23).

During the ninth removal process, the third dummy masking structure (1806 of FIG. 23) reduces a maximum dimension of the second conductive layer (2302 of FIG. 23) to be removed by the ninth removal process. Thus, in some embodiments, as a result of the reduction in the maximum dimensions of the second conductive layer (2302 of FIG. 23) for removal by the ninth removal process, the etching time(s) of the ninth removal process may be reduced. Then, portions 2404 of the second conductive layer (2302 of FIG. 23) that are arranged directly below the eighth masking structure 2402 and closest to the third fin structures 116 are not exposed to the ninth removal process as long. Therefore, removal of the portions 2404 of the second conductive layer (2302 of FIG. 23) is prevented or at least mitigated. In other embodiments, without the third dummy masking structure 1806, it will be appreciated that over-etching by the ninth removal process could remove portions of the second gate electrode layer 216 arranged below the eighth masking structure 2402, thereby compromising the reliability of the second gate electrode layer 216. Thus, because of the third dummy masking structure 1806, the ninth removal process is quicker and exposure of the portions 2404 of the second conductive layer (2302 of FIG. 23) to the etchant(s) of the ninth removal process is reduced, thereby preventing damage to the second gate electrode layer 216.

Further, in some embodiments, after the second conductive layer (2302 of FIG. 23) is removed from the third fin structure 116 and the third nanosheet channel structures 206, a tenth removal process is conducted to completely remove the third dummy masking structure (1806 of FIG. 23) that is uncovered by the eighth masking structure 2402. In such embodiments, the tenth removal process may comprise the same etchant as the sixth and eighth removal processes used to remove the first and second dummy masking structures (1802, 1804 of FIG. 18), respectively. In such embodiments, the etchant used in the tenth removal process removes the dummy masking material without removing the gate dielectric material of the gate dielectric layer 212 and without removing the second gate electrode layer 216. Therefore, the third dummy masking structure (1806 of FIG. 23) advantageously reduces over-etching of the second conductive layer (2302 of FIG. 23) during the ninth removal process without damaging other features (e.g., the second gate electrode layer 216, the gate dielectric layer 212) of the final device.

After the ninth and tenth removal processes, a second nanosheet field effect transistor (NSFET) 104 is formed comprising the second nanosheet channel structures 204 embedded in a second gate electrode structure 132, wherein the second gate electrode structure 132 includes the second gate electrode layer 216, the gate dielectric layer 212, and the interfacial layer 210. The second NSFET 104 may have a second threshold voltage that is at least influenced by the materials and/or thicknesses of the second gate electrode layer 216 and the gate dielectric layer 212.

Figure 25:
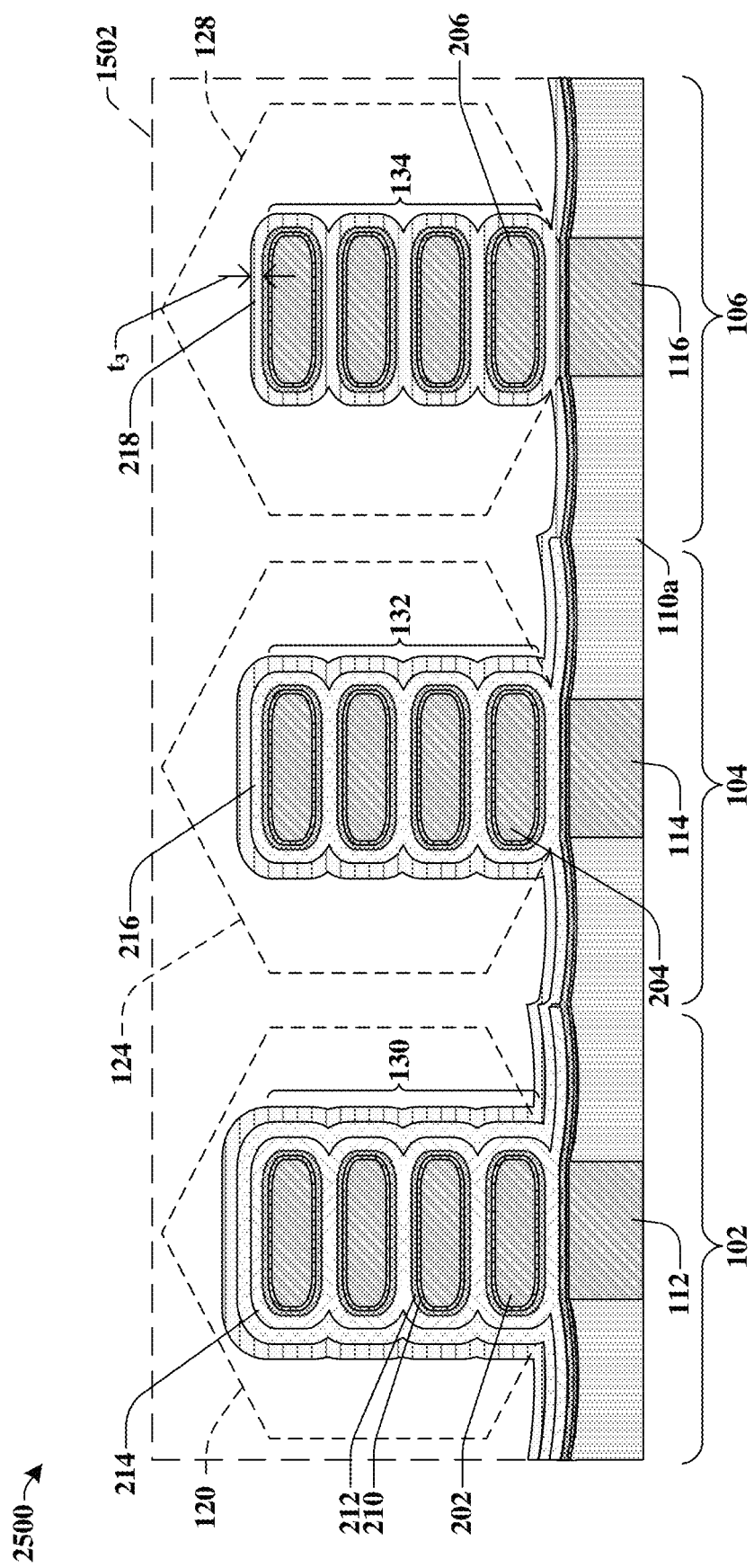

As shown in cross-sectional view 2500 of FIG. 25, in some embodiments, the eighth masking structure (2402 of FIG. 24) is removed, and a third gate electrode layer 218 is formed over the third fin structure 116 and over and around the third nanosheet channel structures 206. In some embodiments, the third gate electrode layer 218 is formed to have a third thickness $t_3$. In some embodiments, the third thickness $t_3$ is at least equal to one half of the third distance ($d_3$ of FIG. 16) such that the third gate electrode layer 218 is a continuously connected layer from the cross-sectional view 2500 and completely surrounds each of the third nano sheet channel structures 206. In some embodiments, the third gate electrode layer 218 is also formed over outer surfaces of the second gate electrode layer 216, and thus, the third gate electrode layer 218 is arranged over the first and second fin structures 112, 114 and over the first and second nanosheet channel structures 202, 204. In such embodiments, the third gate electrode layer 218 does not continuously surround each of the first and second nanosheet channel structures 202, 204 and does not affect or does not significantly affect the first work function of the first NSFET 102 or the second work function of the second NSFET 104.

In some embodiments, the third gate electrode layer 218 is formed by way of a deposition process (e.g., physical vapor deposition (PVD), chemical vapor deposition (CVD), PE-CVD, atomic layer deposition (ALD), sputtering, etc.). In some embodiments, the third gate electrode layer 218 comprises a conductive material that is an n-type work function metal (e.g., titanium aluminum, titanium aluminum carbide, tantalum aluminum carbide, titanium silicon aluminum carbide, etc.), that is a p-type work function metal (e.g., titanium nitride, tungsten carbon nitride, tungsten, tantalum nitride, etc.), or that is a mid-gap type work function metal (e.g., titanium aluminum nitride, titanium silicon nitride, titanium nitride and silicon, etc.). Further, in some embodiments, prior to the formation of the third gate electrode layer 218, a passivation layer may be formed surrounding each of the third nanosheet channel structures 206. In such embodiments (not shown), the passivation layer may comprise, for example, titanium nitride, silicon, or some other suitable passivation material.

After the formation of the third gate electrode layer 218, a third nanosheet field effect transistor (NSFET) 106 is formed comprising the third nanosheet channel structures 206 embedded in a third gate electrode structure 134, wherein the third gate electrode structure 134 includes the third gate electrode layer 218, the gate dielectric layer 212, and the interfacial layer 210. The third NSFET 106 may have a third threshold voltage that is at least influenced by the materials and/or thicknesses of the third gate electrode layer 218 and the gate dielectric layer 212.

Figure 26:
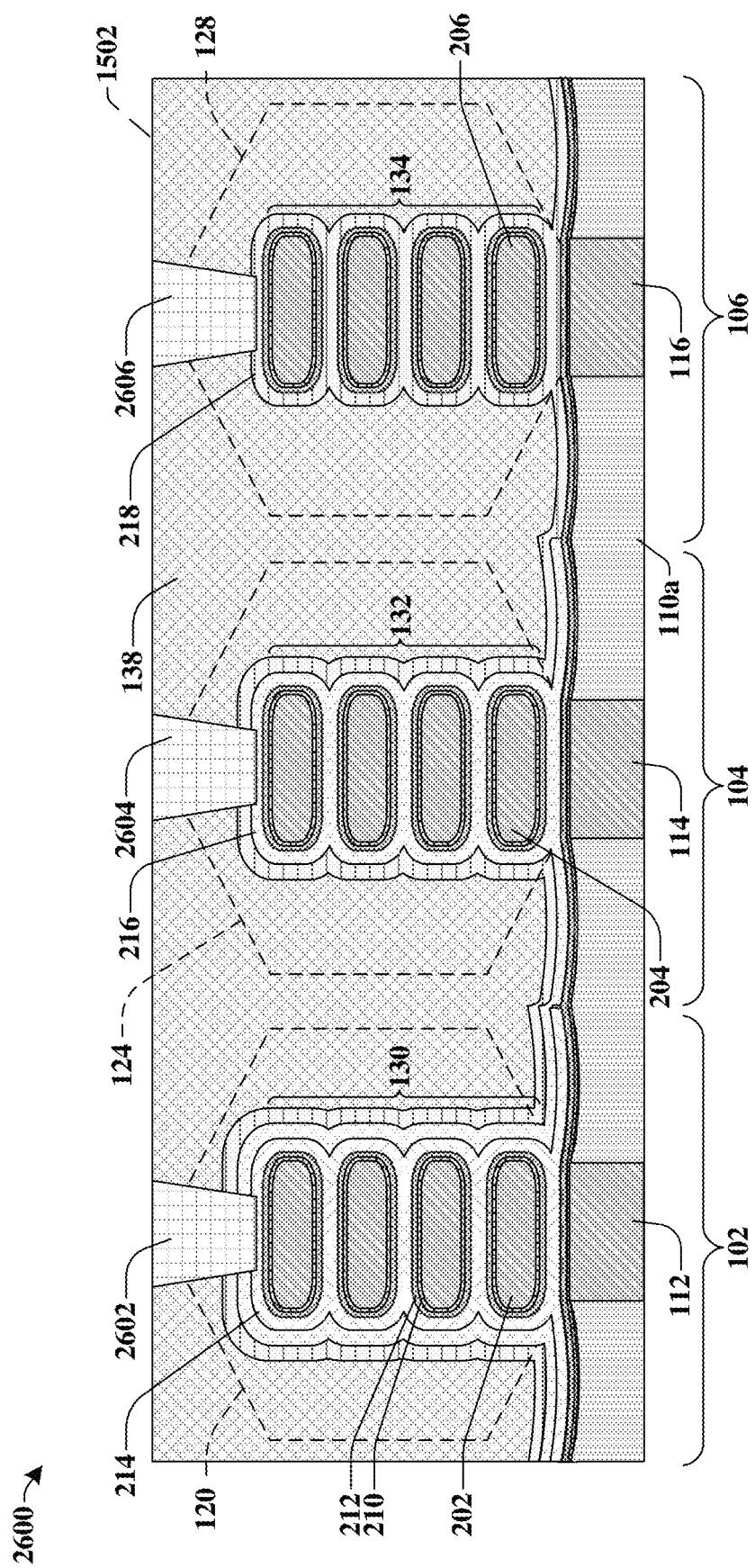

As shown in cross-sectional view 2600 of FIG. 26, in some embodiments, a filler layer 138 is formed over the first, second, and third NSFETs 102, 104, 106. In some embodiments, the filler layer 138 comprises a conductive material such as, for example, titanium nitride, tantalum nitride, tungsten carbon nitride, or some other suitable material. In some embodiments, the filler layer 138 is formed by way of a deposition process (e.g., CVD, PE-CVD, PVD, ALD, sputtering, etc.). Further, in some embodiments, the filler layer 138 does not affect or does not significantly affect the first work function of the first gate electrode structure 130, the second work function of the second gate electrode structure 132, or the third work function of the third gate electrode structure 134.

Further, in some embodiments, a first contact via 2602, a second contact via 2604, and a third contact via 2606 may be formed within the filler layer 138. In some embodiments, the first contact via 2602, the second contact via 2604, and the third contact via 2606 may respectively contact the first gate electrode structure 130, the second gate electrode structure 132, and the third gate electrode structure 134. In some embodiments, the first, second, and third contact vias 2602, 2604, 2606 may comprise, for example, tungsten, aluminum, copper, or some other suitable conductive material. In some embodiments, the first, second, and third contact vias 2602, 2604, 2606 may be formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching). During operation, in some embodiments, the first, second, and third contact vias 2602, 2604, 2606 may be coupled to gate electrode sources to selectively control which of the first, second, and/or third NSFETs 102, 104, 106 may be turned "ON" according to their threshold voltages during operation.

In some embodiments, the first NSFET 102, the second NSFET 104, and the third NSFET 106 may comprise different gate electrode structures (130, 132, 134) and thus, may comprise different threshold voltages. Nevertheless, because of the first, second, and third dummy masking structures (1802, 1804, 1806 of FIG. 18), the first, second, and third NSFETs 102, 104, 106 may be reliably formed beside one another over a same substrate. It will be appreciated that the method depicted in FIGS. 4-26 may be modified to accommodate more or less than the first, second, and third NSFETs 102, 104, 106.

Figure 27:
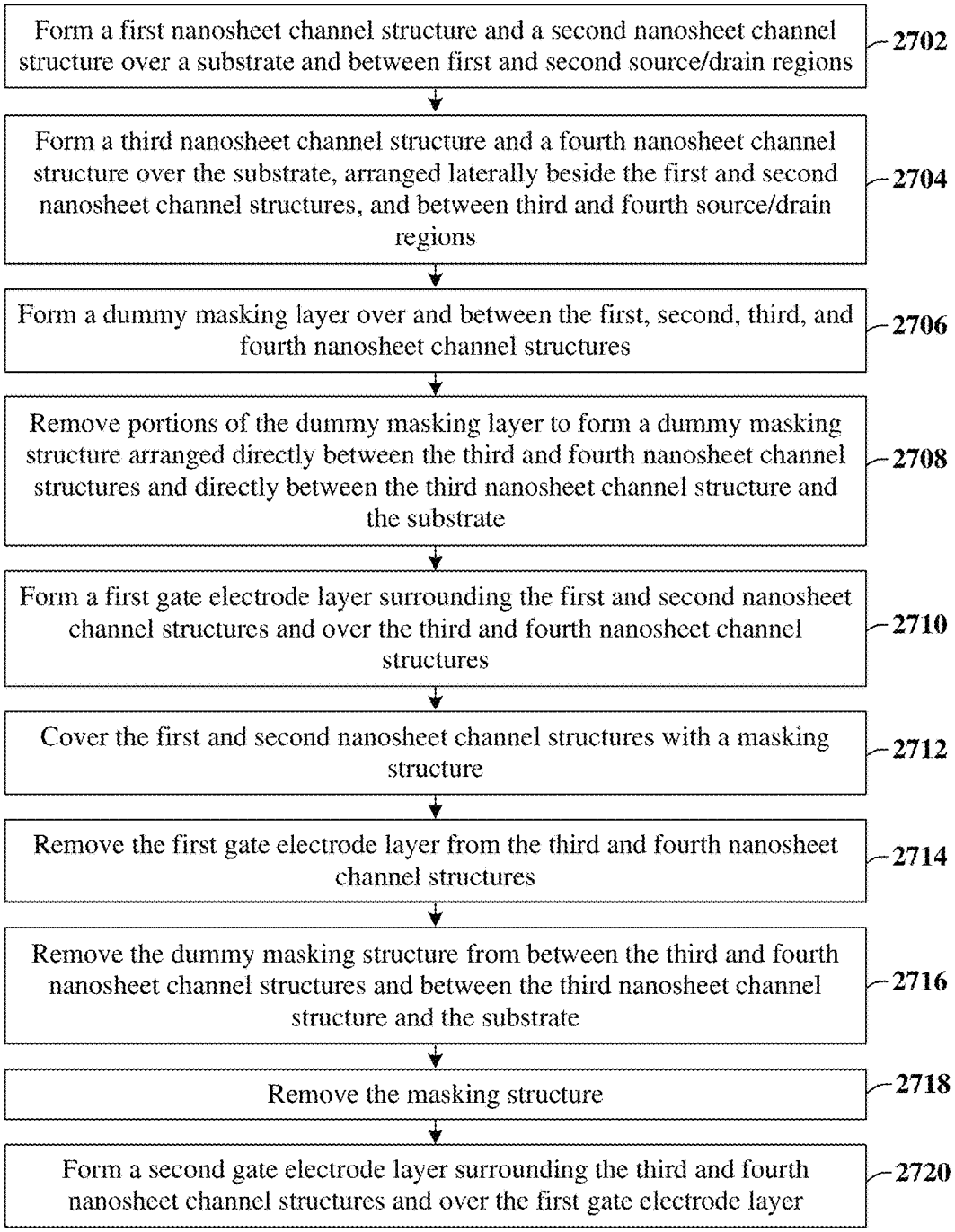
FIG. 27 illustrates a flow diagram of some embodiments of a method corresponding to FIGS. 4-26.

FIG. 27 illustrates a flow diagram of some embodiments of a method 2700 of forming a first NSFET having a first gate electrode layer beside a second NSFET having a second gate electrode layer that is different from the first gate electrode layer.

While method 2700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2702, a first nanosheet channel structure and a second nanosheet channel structure are formed over a substrate and between first and second source/drain regions.

At act 2704, a third nanosheet channel structure and a fourth nanosheet channel structure are formed over the substrate, arranged laterally beside the first and second nanosheet channel structures, and between the third and fourth source/drain regions. FIG. 15 illustrates cross-sectional view 1500 of some embodiments corresponding to acts 2702 and 2704.

At act 2706, a dummy masking layer is formed over and between the first, second third, and fourth nanosheet channel structures. FIG. 17 illustrates cross-sectional view 1700 of some embodiments corresponding to act 2706.

At act 2708, portions of the dummy masking layer are removed to form a dummy masking structure arranged directly between the third and fourth nanosheet channel structures and directly between the third nanosheet channel structure and the substrate. FIG. 18 illustrates cross-sectional view 1800 of some embodiments corresponding to act 2708.

At act 2710, a first gate electrode layer surrounding the first and second nanosheet channel structures is formed. The first gate electrode layer is also formed over the third and fourth nanosheet channel structures. FIG. 20 illustrates cross-sectional view 2000 of some embodiments corresponding to act 2710.

At act 2712, the first and second nanosheet channel structures are covered with a masking structure.

At act 2714, the first gate electrode layer is removed from the third and fourth nanosheet channel structures. FIG. 21 illustrates cross-sectional view 2100 of some embodiments corresponding to acts 2712 and 2714.

At act 2716, the dummy masking structure is removed from between the third and fourth nanosheet channel structures and from between the third nanosheet channel structure and the substrate. FIG. 22 illustrates cross-sectional view 2200 of some embodiments corresponding to act 2716.

At act 2718, the masking structure is removed.

At act 2720, a second gate electrode layer is formed that surrounds the third and fourth nanosheet channel structure and over the first gate electrode layer. FIG. 23 illustrates cross-sectional view 2300 of some embodiments corresponding to act 2720.

Therefore, the present disclosure relates to a method of forming a first NSFET having a first gate electrode structure laterally beside a second NSFET having a second gate electrode structure using a dummy masking structure to increase device density while still maintaining reliability of the first and second NSFETs.

Accordingly, in some embodiments, the present disclosure relates to an integrated chip comprising: a first nanosheet field effect transistor (NSFET) arranged over a substrate and having a first threshold voltage and comprising: a first gate electrode layer extending from a first source/drain region to a second source/drain region, and first nanosheet channel structures embedded in the first gate electrode layer and also extending from the first source/drain region to the second source/drain region; a second NSFET arranged laterally beside the first NSFET and over the substrate, having a second threshold voltage different from the first threshold voltage, and comprising: a second gate electrode layer extending from a third source/drain region to a fourth source/drain region, and second nanosheet channel structures embedded in the second gate electrode layer and also extending from the third source/drain region to the fourth source/drain region; and a third NSFET arranged laterally beside the second NSFET and over the substrate, having a third threshold voltage different from the second threshold voltage, and comprising: a third gate electrode layer extending from a fifth source/drain region to a sixth source/drain region, and third nanosheet channel structures embedded in the third gate electrode layer and also extending from the fifth source/drain region to the sixth source/drain region.

In other embodiments, the present disclosure relates to an integrated chip comprising: a first nanosheet field effect transistor (NSFET) comprising: a first nanosheet channel structure arranged over a substrate; a second nanosheet channel structure arranged directly over the first nanosheet channel structure and extending in parallel from a first source/drain region to a second source/drain region; and a first gate electrode layer continuously surrounding the first and second nanosheet channel structures and arranged directly between the first and second nanosheet channel structures; a second NSFET comprising: a third nanosheet channel structure arranged over the substrate; a fourth nanosheet channel structure arranged directly over the third nanosheet channel structure and extending in parallel from a third source/drain region to a fourth source/drain region; and a second gate electrode layer continuously surrounding the third and fourth nanosheet channel structures and arranged directly between the third and fourth nanosheet channel structures, wherein the second gate electrode layer comprises a different material than the second gate electrode layer; and a third NSFET comprising: a fifth nanosheet channel structure arranged over the substrate; a sixth nanosheet channel structure arranged directly over the fifth nanosheet channel structure and extending in parallel from a fifth source/drain region to a sixth source/drain region; and a third gate electrode layer continuously surrounding the fifth and sixth nanosheet channel structures and arranged directly between the fifth and sixth nanosheet channel structures, wherein the third gate electrode layer comprises a different material than the first gate electrode layer and the second gate electrode layer.

In yet other embodiments, the present disclosure relates to a method of forming an integrated chip comprising: forming a first nanosheet channel structure and a second nanosheet channel structure over a substrate and extending in parallel between first and second source/drain regions, wherein the second nanosheet channel structure is arranged directly over the first nanosheet channel structure; forming a third nanosheet channel structure and a fourth nanosheet channel structure over the substrate, arranged laterally beside the first nanosheet channel structure and the second nanosheet channel structure, and extending in parallel between third and fourth source/drain regions, wherein the fourth nanosheet channel structure is arranged directly over the third nanosheet channel structure; forming a dummy masking layer over and between the first, second, third, and fourth nanosheet channel structures; removing portions of the dummy masking layer from the first, second, third, and fourth nanosheet channel structures to form a dummy masking structure is arranged directly between the third nanosheet channel structure and the fourth nanosheet channel structure and directly between the third nanosheet channel structure and the substrate; forming a first gate electrode layer surrounding the first and second nanosheet channel structures and over the third and fourth nanosheet channel structures; covering the first and second nanosheet channel structures with a masking structure; removing the first gate electrode layer from the third and fourth nanosheet channel structures; removing the dummy masking structure; removing the masking structure; and forming a second gate electrode layer surrounding the third and fourth nanosheet channel structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated chip, comprising:
a first plurality of channel structures disposed over a substrate and extending in parallel between a first source/drain region and a second source/drain region, wherein the first plurality of channel structures are vertically separated from one another;
a first gate electrode layer continuously surrounding and arranged directly between the first plurality of channel structures;
a second plurality of channel structures disposed over the substrate and extending in parallel between a third source/drain region and a fourth source/drain region, wherein the second plurality of channel structures are vertically separated from one another;
a second gate electrode layer continuously surrounding and arranged directly between the second plurality of channel structures;
a third plurality of channel structures disposed over the substrate and extending in parallel between a fifth source/drain region and a sixth source/drain region, wherein the third plurality of channel structures are vertically separated from one another; and
a third gate electrode layer continuously surrounding and arranged directly between the third plurality of channel structures, wherein the third gate electrode layer laterally overlaps both the first gate electrode layer and the second gate electrode layer.

2. The integrated chip of claim 1,
wherein the first gate electrode layer has an outermost sidewall laterally between the first plurality of channel structures and the second plurality of channel structures; and
wherein the second gate electrode layer laterally overlaps the first gate electrode layer.

3. The integrated chip of claim 2, wherein the second gate electrode layer continuously extends from along the outermost sidewall of the first gate electrode layer to directly over the first gate electrode layer.

4. The integrated chip of claim 1, wherein the first gate electrode layer has a first work function, the second gate electrode layer has a second work function, and the third gate electrode layer has a third work function.

5. The integrated chip of claim 4,
wherein the first plurality of channel structures and the second plurality of channel structures have a first conductivity type; and
wherein the third plurality of channel structures have a second conductivity type that is different than the first conductivity type.

6. The integrated chip of claim 1, wherein the second gate electrode layer continuously extends from directly between the second plurality of channel structures to along opposing sides of the first plurality of channel structures, the second gate electrode layer having sidewalls directly and laterally between the first plurality of channel structures and the second plurality of channel structures.

7. The integrated chip of claim 1, wherein the second gate electrode layer comprises a plurality of indentations along a sidewall of the second gate electrode layer, the plurality of indentations being vertically disposed between adjacent ones of the second plurality of channel structures.

8. The integrated chip of claim 1, further comprising:
a filler layer arranged directly between a sidewall of the first gate electrode layer and a sidewall of the second gate electrode layer.

9. The integrated chip of claim 1, wherein the first gate electrode layer comprises a first indentation having a first depth between neighboring ones of the first plurality of channel structures, the second gate electrode layer comprises a second indentation having a second depth between the neighboring ones of the first plurality of channel structures, and the third gate electrode layer comprises a third indentation having a third depth between the neighboring ones of the first plurality of channel structures, the first depth being larger than the second depth and the second depth being larger than the third depth.

10. A method of forming an integrated chip comprising:
forming a first plurality of channel structures over a substrate and extending in parallel between a first source/drain region and a second source/drain region;
forming a second plurality of channel structures arranged laterally beside the first plurality of channel structures and extending in parallel between a third source/drain region and a fourth source/drain region;
forming a dummy mask on the first plurality of channel structures and the second plurality of channel structures;
etching the dummy mask to remove the dummy mask from laterally outside of the first plurality of channel structures and the second plurality of channel structures, wherein the dummy mask remains vertically between the first plurality of channel structures and the second plurality of channel structures after the etching is completed;
forming a first gate electrode layer on the first plurality of channel structures and the second plurality of channel structures;
covering the first plurality of channel structures with a mask;
removing the first gate electrode layer from the second plurality of channel structures with the mask covering the first plurality of channel structures; and
forming a second gate electrode layer on the second plurality of channel structures.

11. The method of claim 10, further comprising:
forming the second gate electrode layer on the first plurality of channel structures.

12. The method of claim 10, further comprising:
forming the first gate electrode layer on sidewalls of the dummy mask.

13. The method of claim 10, further comprising:
removing the dummy mask from between the second plurality of channel structures after removing the first gate electrode layer from the second plurality of channel structures.

14. The method of claim 10, further comprising:
forming a third plurality of channel structures over the substrate and extending in parallel between a fifth source/drain region and a sixth source/drain region; and
forming a third gate electrode layer on the third plurality of channel structures, wherein the third gate electrode layer continuously extends over the first gate electrode layer and the second gate electrode layer.

15. An integrated chip, comprising:
a first channel structure extending between a first source/drain region and a second source/drain region;
a first gate electrode layer wrapping around the first channel structure in a first closed loop;
a second channel structure extending between a third source/drain region and a fourth source/drain region;
a second gate electrode layer wrapping around the second channel structure in a second closed loop, wherein the second gate electrode layer continuously extends from around the second channel structure to cover the first gate electrode layer;
a third channel structure extending between a fifth source/drain region and a sixth source/drain region; and
a third gate electrode layer wrapping around the third channel structure in a third closed loop, wherein the third gate electrode layer continuously extends from around the third channel structure to cover the second gate electrode layer.

16. The integrated chip of claim 15,
wherein the second gate electrode layer covers an outermost sidewall of the first gate electrode layer, the outermost sidewall of the first gate electrode layer being vertically below the first channel structure, and
wherein the third gate electrode layer covers an outermost sidewall of the second gate electrode layer, the outermost sidewall of the second gate electrode layer being vertically below the second channel structure.

17. The integrated chip of claim 15, wherein the third gate electrode layer continuously extends from over the third channel structure to over the second channel structure and to over the first channel structure.

18. The integrated chip of claim 15, wherein the second gate electrode layer has an interior sidewall contacting an exterior sidewall of the first gate electrode layer and the second gate electrode layer further has an exterior sidewall contacting an interior sidewall of the third gate electrode layer.

19. The integrated chip of claim 15, wherein the second gate electrode layer laterally and vertically separates the first gate electrode layer from the third gate electrode layer.

20. The integrated chip of claim 15,
wherein the third gate electrode layer comprises a first upper surface laterally between the first channel structure and the second channel structure; and
wherein the third gate electrode layer further comprises a second upper surface laterally between the second channel structure and the third channel structure, the second upper surface being vertically below the first upper surface.

* * * * *